(12) United States Patent  
Miyanishi et al.

(10) Patent No.: US 8,331,057 B2
(45) Date of Patent: Dec. 11, 2012

(54) ELECTROMAGNETIC FIELD DETECTING ELEMENT UTILIZING BALLISTIC CURRENT PATHS

(75) Inventors: Shintaro Miyanishi, Nara (JP); Yasushi Ogimoto, Higashiyamato (JP); Yoshiteru Murakami, Nishinomiya (JP); Kunio Kojima, Nabari (JP)

(73) Assignee: Sharp Kabushiki Kaisha, Osaka (JP)

( * ) Notice: Subject to any disclaimer, the term of this patent is extended or adjusted under 35 U.S.C. 154(b) by 803 days.

(21) Appl. No.: 12/067,974

(22) PCT Filed: Sep. 25, 2006

(86) PCT No.: PCT/JP2006/318929  
§ 371 (c)(1),  
(2), (4) Date: Jul. 31, 2009

(87) PCT Pub. No.: WO2007/040072  
PCT Pub. Date: Apr. 12, 2007

(65) Prior Publication Data  
US 2009/0296258 A1 Dec. 3, 2009

(30) Foreign Application Priority Data  
Oct. 3, 2005 (JP) ................................. 2005-289567

(51) Int. Cl.  
*G11B 5/33* (2006.01)

(52) U.S. Cl. ...................... 360/110; 324/609; 250/338.4

(58) Field of Classification Search ............... 360/324.1, 360/324.11, 324.12, 324.2, 110; 324/609, 324/629; 250/338.4; 327/510  
See application file for complete search history.

(56) References Cited

U.S. PATENT DOCUMENTS

| 5,247,223 A | 9/1993 | Mori et al. |
| 5,731,584 A * | 3/1998 | Beyne et al. ................. 250/374 |
| 6,534,841 B1 | 3/2003 | Van Brocklin et al. |
| 7,365,327 B2 * | 4/2008 | Baniecki et al. ........... 250/338.4 |
| 7,852,392 B2 * | 12/2010 | Mochizuki .................... 348/307 |
| 7,888,756 B2 * | 2/2011 | Mather et al. ............... 257/421 |
| 7,916,427 B1 * | 3/2011 | Lauer .......................... 360/294.4 |
| 2004/0194119 A1 | 9/2004 | Miyanishi et al. |
| 2006/0049474 A1 * | 3/2006 | Nguyen Van Dau .......... 257/423 |

(Continued)

FOREIGN PATENT DOCUMENTS  
JP 02-125472 A 5/1990  
(Continued)

OTHER PUBLICATIONS

Hidetochi Fukuyama, "Series Bussei Butsuri no Shintenkai, Mesoscopic kei no Butsuri", Maruzen Kabushiki kaisya, Publishing Dept., (1996) pp. 55-57. Catalog No. ISBN4-621-04236X C3342 P5665E.

(Continued)

*Primary Examiner* — Jefferson Evans  
(74) *Attorney, Agent, or Firm* — Edwards Wildman Palmer LLP; David G. Conlin; Steven M. Jensen

(57) ABSTRACT

Examples of an electromagnetic field detecting element according to the present invention includes a substrate, a pair of electrodes, three insulation layers disposed on the substrate and between the electrodes. The three insulation layers are designed to have two or three different dielectric breakdown strength. At least two ballistic current paths are formed between the electrodes. With this structure, it is possible to perform at a room temperature a highly efficient electromagnetic field detection utilizing Aharonov-Bohm effect or Aharonov-Casher effect.

20 Claims, 23 Drawing Sheets

U.S. PATENT DOCUMENTS

| | | | |
|---|---|---|---|
| 2006/0221510 A1* | 10/2006 | Parkin | 360/324.2 |
| 2007/0297103 A1* | 12/2007 | Zhang et al. | 360/324.12 |
| 2008/0088982 A1* | 4/2008 | Folks et al. | 360/324 |
| 2008/0232002 A1 | 9/2008 | Mather et al. | 360/324.2 |
| 2008/0258690 A1* | 10/2008 | Odagawa et al. | 320/154 |
| 2008/0291584 A1* | 11/2008 | Parkin | 360/324.2 |
| 2009/0051452 A1* | 2/2009 | Asada et al. | 331/107 T |
| 2009/0091865 A1* | 4/2009 | Zhang et al. | 360/324.12 |
| 2011/0068853 A1* | 3/2011 | Worschech et al. | 327/510 |

FOREIGN PATENT DOCUMENTS

| | | |
|---|---|---|
| JP | 02-306412 A | 12/1990 |
| JP | 4-62973 | 2/1992 |
| JP | 06-177447 A | 6/1994 |
| JP | 2003-197867 A | 7/2003 |
| JP | 2004-303299 A | 10/2004 |

OTHER PUBLICATIONS

Kato et al., "Coherent spin manipulation without magnetic fields in strained semiconductors," Nature, vol. 427 (2004); pp. 50-53.

Aharonov et al., "Topological Quantum Effects for Neutral Particles," Physical Review Letters, vol. 53, No. 4 (1984), pp. 319-321.

International Preliminary Report on Patentability for related Application No. PCT/JP2006/318929 (5 pages).

* cited by examiner

ELECTROMAGNETIC FIELD DETECTING ELEMENT UTILIZING BALLISTIC CURRENT PATHS

TECHNICAL FIELD

The present invention relates to: an electromagnetic field detecting element, an electromagnetic field detecting sensor, and an electromagnetic field detecting circuit each of which is for detecting a minimal magnetic bit during a high-density magnetic recording; and an information recording/reproducing (reading) head and an information recording/reproducing device each for recording/reproducing electromagnetic field information.

BACKGROUND ART

The calculation capacities and information communication capabilities of computers have improved, prompting demand for dramatically higher performance of external information storage devices in recent years. In particular, there is a growing demand for a hard disk drive capable of high density recording of over 1 Tb/inch$_2$. However, with the record surface density of 1 Tb/inch$^2$, the size corresponding to one bit is approximately 25 nm square or the like, and the size corresponding to each record bit is extremely small. For this reason, detection of recorded information is expected to be difficult with an element of a known spin valve scheme such as a GMR (Giant Magneto Resistance) element or a TMR (Tunnel Magneto Resistance) element. Under such circumstances, there is a demand for an element for achieving the required standard of the 1 Tb/inch$^2$, based on a detection principle that are distinct over the known principle.

As a new detection principle different from the known ones, there is Aharonov-Bohm (AB) effect which is described in the below-listed non-patent document 1. This is an effect that, when electron waves propagate while maintaining coherency thereof, the phase difference of the two electron waves is affected by a vector potential formed by a magnetic flux penetrating a space between the paths of the two electron waves. This will be hereinafter described again with further detail. Further, patent document 1 discloses a magnetic field detector utilizing the AB effect and the coherency of the electrons. Further, the below-listed non-patent document 2 reports that, even without the presence of a magnetic field, phases of electron waves vary with application of an electric field inside a substance due to spin orbital interaction of the substance (Aharonov-Casher (AC) effect; see non-patent document 3 for more detail of this effect). In a known magnetism detecting element, it is necessary to temporarily transfer a magnetic field onto a soft magnetism layer, prior to detecting variation in a magnet resistance. On the other hand, in an electromagnetic field detecting element utilizing AB effect or AC effect as a detection principle, the target to be detected is a vector potential and not an electromagnetic field, and therefore does not require the transferring process. Therefore, no attenuation or delay attributed to the transfer process will take place. This is advantageous in that a highly efficient electromagnetic field detection is possible, and reproducing of extremely small magnetic bits is possible.

[Patent document 1] Japanese Unexamined Patent Publication No. 306412/1990 (Tokukaihei 2-306412)
[Non-patent document 1] Hidetoshi FUKUYAMA, "Series Bussei Butsuri no Shintenkai, Mesoscopic kei no Butsuri", P. 55 to 57, Published in 1996 by MARUZEN Kabushiki kaisya, Publishing dept.
[Non-patent document 2] "NATURE VOL. 427", P. 50 to 53, Published in January, 2004
[Non-patent document 3] "Physical Review Letters Vol. 53", P. 319 to 321, Published in July 1984

DISCLOSURE OF THE INVENTION

Technical Problem

However, the magnetic field detector of Patent document 1 adopts a semiconductor as a current path of electrons. Therefore, to realize the coherency effect (AB effect) of electrons in a magnetic field, it is necessary to maintain the coherency of electrons by maintaining the semiconductor serving as the current path at a low temperature. Accordingly, at a room temperature, the coherency of electrons in the semiconductor is not maintained and magnetic field detection utilizing AB effect is not possible. Further, the magnetic field detector of Patent document 1 is not able to yield AC effect which is a coherency effect of the electrons in the electric field, at a room temperature. AC effect is detailed later.

In view of the above problem, the present invention was made, and it is an object of the present invention to provide: an electromagnetic field detecting element, an electromagnetic field detecting sensor, and an electromagnetic field detecting circuit each of which is capable of detecting an electromagnetic field at a room temperature, utilizing AB effect or AC effect; and an information recording/reproducing head and an information recording/reproducing device for recording/reproducing electromagnetic field information, each of which includes the electromagnetic field detecting element, the electromagnetic field detecting sensor, or the electromagnetic field detecting circuit.

Technical Solution and Advantageous Effects (1) An electromagnetic field detecting element of the present invention includes: a pair of opposing electrodes arranged in an insulation area so as to posses opposing surfaces facing each other; and a first insulator which is disposed between the pair of opposing electrodes so as to be disposed within an overlapping area of the opposing surfaces, while being apart from boundaries on both ends of the overlapping areas in one direction along the opposing surfaces, and which insulator has a dielectric breakdown strength larger than a part of the insulation area between the pair of electrodes.

With the configuration, two ballistic current paths interposing therebetween the first insulator are formed between the pair of opposing electrodes, upon application of an electric field to an area between the pair of opposing electrodes, the electric field having a magnitude or strength which causes dielectric breakdown in the part of the insulation area between the pair of opposing electrodes while causing no dielectric breakdown in the first insulator. In short, two ballistic current paths interposing therebetween the first insulator is formed at a room temperature. When there is an electromagnetic field in or nearby the area between the two current paths, a phase change will take place in the ballistic carriers (i.e., carriers having coherency) respectively passing the two current paths, due to a vector potential derived from the electromagnetic field. As a result, coherency (AB effect for magnetic field, and AC effect for electric field) attributed to a difference in the phases of the carrier having passed the two current paths will take place. In other words, since the electric conductance between the opposing electrodes varies due to a vector potential of an external electromagnetic field, a static external electromagnetic field including an electromagnetic wave and a near field is detected by measuring an electric characteristic of the electromagnetic field detecting element at a room temperature. Further, by detecting a change in the electromagnetic field in or nearby the area interposed between the two current paths in the form of a change in the electric conductance between the opposing electrodes, it is also possible to detect a dynamic external electromagnetic field at a room temperature.

(2) An electromagnetic field detecting element of the present invention includes: a pair of opposing electrodes arranged in an insulation area so as to posses opposing surfaces facing each other; and a first insulator which is disposed between the pair of opposing electrodes, and which has a dielectric breakdown strength larger than a part of the insulation area between the pair of electrodes, wherein two ballistic current paths interposing therebetween the first insulator are formed between the pair of opposing electrodes, upon application of an electric field to an area between the pair of opposing electrodes, the electric field having a magnitude which causes dielectric breakdown in the part of the insulation area between the pair of opposing electrodes while causing no dielectric breakdown in the first insulator.

When there is an electromagnetic field in or nearby the area between the two ballistic current paths interposing the first insulator in the above configuration, a phase change will take place in the ballistic carriers respectively passing the two current paths formed at a room temperature, due to a vector potential derived from the electromagnetic field. As a result, coherency attributed to a difference in the phases of the carrier having passed the two current paths will take place. In other words, since the electric conductance between the opposing electrodes varies due to a vector potential of an external electromagnetic field, a static external electromagnetic field including an electromagnetic wave and a near field is detected by measuring an electric characteristic of the electromagnetic field detecting element at a room temperature. Further, by detecting a change in the electromagnetic field in or nearby the area interposed between the two current paths in the form of a change in the electric conductance between the opposing electrodes, it is also possible to detect a dynamic external electromagnetic field at a room temperature.

As described, the electromagnetic field detecting elements of the above (1) and (2) allow a highly efficient detection of an electromagnetic field at a room temperature. Further, the electromagnetic field detecting element of the present invention is advantageous in that each element thereof has a relatively simple structure, and therefore production of the element is easy.

Note that, in (1) and (2), the insulation area may be a solid, gas, or liquid, provided that the dielectric breakdown strength of the area between the pair of opposing electrodes is smaller than that of the first insulator. For example, when the insulation area is a gas or a liquid, the insulation area is a part of the electromagnetic field detecting element.

(3) The electromagnetic field detecting element of the present invention is preferably adapted so that the part of the insulation area between the opposing electrodes includes a second and a third insulators disposed so as to interpose therebetween the first insulator while contacting the first insulator. By interposing the first insulator between the two insulators contacting the first insulator, the electric characteristic of the electromagnetic field detecting element is stabilized, and therefore more highly accurate detection of an external electromagnetic field detection is possible.

(4) The electromagnetic field detecting element of (3) is preferably adapted so that respective widths of the second and third insulators in the one direction along the opposing surfaces are not more than a mean free path of electrons in a conductive material constituting the pair of opposing electrodes. That way, it is possible to increase the coherency of the ballistic carriers arrived at the electrode.

(5) The electromagnetic field detecting element of (3) is preferably adapted so that the second and third insulators contact both of the two opposing surfaces of the pair of opposing electrodes. That way, it is possible to increase the coherency of the carriers arrived at the electrode.

(6) The electromagnetic field detecting element of (3) is preferably adapted so that the first to third insulators form a lamination whose surfaces are parallel to each other. That way, it is possible to detect an electromagnetic field in a minute area.

(7) The electromagnetic field detecting element of (3) is preferably adapted so that the opposing surfaces are orthogonal to the surfaces of the first to third insulators. That way, it is possible to increase the coherency of the carriers arrived at the electrode.

(8) The electromagnetic field detecting element of (3) is preferably adapted so that at least one of the first to third insulators is made of a material having a magnetic permeability of three or more. That way, the phases of the carriers passing the current paths are shifted through shifting of a magnetic field generated by an insulator made of a material having a magnetic permeability of three or more. Thus, the sensitivity of detecting an external electromagnetic field is improved.

(9) The electromagnetic field detecting element of (3) is preferably adapted so that at least one of the first to third insulators is made of a material having a dielectric constant of four or more. That way, the phases of the carriers passing the current paths are shifted through shifting of a magnetic field generated by an insulator made of a material having a magnetic permeability of four or more. Thus, the sensitivity of detecting an external electromagnetic field is improved.

(10) The electromagnetic field detecting element of (1) or (2) is preferably adapted so that the shortest distance between the two opposing surfaces of the pair of electrodes is 100 nm or less. With this, it is possible to cause a dielectric breakdown of the insulation area, while avoiding an increase in the voltage between the pair of opposing electrodes.

(11) The electromagnetic field detecting element of (1) or (2) is preferably adapted so that a width of the first insulator in the one direction along the opposing surface is not more than a double of a mean free path of electrons in a conductive material constituting the pair of opposing electrodes. That way, it is possible to increase the coherency of the carriers arrived at the electrode.

(12) The electromagnetic field detecting element of (11) is preferably adapted so that a width of the first insulator in the one direction along the opposing surface is not more than a mean free path of electrons in a conductive material constituting the pair of opposing electrodes. That way, it is possible to increase the coherency of the ballistic carriers arrived at the electrode.

(13) The electromagnetic field detecting element of (1) or (2) is preferably adapted so that the opposing surfaces each includes two corner portions. With this, the current is selectively converged at the stair-portions at the time of applying an electric field, and ballistic carriers are efficiently generated.

(14) The electromagnetic field detecting element of (1) or (2) is preferably adapted so that the first insulator contacts at least one of the two opposing surfaces of the pair of opposing electrodes. That way, it is possible to increase the coherency of the carriers arrived at the electrode.

(15) An electromagnetic field detecting sensor of the present invention includes: the electromagnetic field detecting element of (1) or (2); and a phase shifting member which causes shifting of a phase of a carrier passing at least one of the two current paths formed between the pair of opposing electrodes in the electromagnetic field detecting element. With this configuration, it is possible to improve the efficiency of detecting an external electromagnetic field, by sifting the phases of the carriers passing the current paths using a factor other than the external electromagnetic field.

(16) The electromagnetic field detecting sensor of (15) is preferably adapted so that the phase shifting member is a magnetic field generating source. With this configuration, a magnetic field generated by the magnetic field generating source causes variation in the vector potential. Therefore, it is possible to shift the phase of the carriers passing the current paths.

(17) Alternatively, The electromagnetic field detecting sensor of (15) may be adapted so that the phase shifting member is an electric field generating source. With this structure, an electric field generated by the electric field generating source causes variation in the band structure in a substance in the first insulator or in the insulation area, through a spin orbital interaction of the substance, thereby varying a vector potential. Accordingly, it is possible to shift the phase of the carriers passing the current paths.

(18) Alternatively, the electromagnetic field detecting sensor of (15) may be adapted so that the phase shifting member is an electromagnetic wave generating source. When an electromagnetic wave generated by an electromagnetic wave generating source causes carrier excitation in the first insulator and/or in the insulation area, or causes accompanying generation of electron and hole pairs, the dielectric constant in the substance of the first insulator and/or the insulation area varies. Then, the electric field in the first insulator and/or the insulation area varies. Therefore, it is possible to shift the phases of the carriers passing the current paths. By utilizing this, it is possible to monitor the power of an electromagnetic wave generated by a laser element or the like. Further, the electromagnetic wave generated by the electromagnetic wave generating source excites the carriers in the insulation area, and generates the electron and hole pairs. Therefore it is possible to cause dielectric breakdown of the insulation area with a low voltage.

(19) Alternatively, The electromagnetic field detecting sensor of (15) may be adapted so that the phase shifting member is a near field generating source. When a near field generated by a near field generating source causes carrier excitation in the first insulator and/or in the insulation area, or causes accompanying generation of electron and hole pairs, the dielectric constant in the substance of the first insulator and/or the insulation area locally varies. Then, the electric field in the first insulator and/or the insulation area varies. Therefore, it is possible to shift the phases of the carriers passing the current paths. By utilizing this, it is possible to monitor the power of a near field generated by a near field generating element or the like.

(20) An electromagnetic field detecting circuit of the present invention includes: the electromagnetic field detecting sensor of (15); and a phase controlling circuit which controls an amount of the phase of the carrier shifted by the phase shifting member. With this, it is possible to maximize the detection sensitivity of the electromagnetic field detecting element.

(21) A magnetic recording/reproducing head of the present invention includes: an electromagnetic field generating element which records electromagnetic field information on an information storage medium; and the electromagnetic field detecting element of (1) or (2) which reads the electromagnetic field information recorded on the information storage medium. Thus, electromagnetic field information recorded on the information storage medium is detected with a high sensitivity by using the electromagnetic field generating element. Accordingly, there is obtained a magnetic recording/reproducing head capable of recording/reproducing electromagnetic field information corresponding to a high storage surface density of over 1 Tb/inch$^2$ for example.

(22) The magnetic recording/reproducing head of (21) is preferably adapted so that: the electromagnetic field detecting element and the electromagnetic field generating element are integrally formed with a slider. The magnetic recording/reproducing head can be manufactured through a manufacturing process similar to that for a known magnetic head. Therefore, the productivity is improved. Further, since the terminals of the elements are formed on the substrate integrally formed with the slider, the access of the terminal to outside is made easier, and therefore the productivity is improved.

(23) An information recording/reproducing device of the present invention includes: the information recording/reproducing head of (21); and moving means for moving the information recording/reproducing head to a predetermined position of the information storage medium. With this, the information recording/reproducing head can be moved to a predetermined position on the information storage medium. Therefore, it is possible to record or reproduce electromagnetic field information in an area of nano size level corresponding to a high storage surface density of over 1 Tb/inch$^2$ for example.

BEST MODE FOR CARRYING OUT THE INVENTION

<Embodiment 1>

The following describes, with reference to the drawings, an electromagnetic field detecting element of Embodiment 1, according to the present invention. FIG. 1 is a perspective view showing a configuration of the electromagnetic field detecting element of Embodiment 1, according to the present invention. FIG. 2 is a diagram showing a configuration of the electromagnetic field detecting element 10 of FIG. 1, viewed in the Y-direction.

To detect an electromagnetic field in a minute area, an electromagnetic field detecting element 10 of the present embodiment includes a substrate 1; and insulation layers 2, 3, and 4 laminated in this order on the substrate 1, as shown in FIG. 1. Further, the electromagnetic field detecting element 10 includes electrodes 5 and 6 which are formed so as to contact (i) the surface of the substrate 1 and (ii) end surfaces of the insulation layers 2, 3, and 4 in a direction of interval L.

The lamination including the insulation layers 2, 3, and 4 is formed so as to be disposed between the respective opposing surfaces 5a and 6a of the electrodes 5 and 6. In particular, to ensure occurrence of dielectric breakdown in the insulation layers 2 and 4, the insulation layer 3 is disposed between the electrodes 5 and 6 so as to be disposed within an overlapping area which is an area overlaps the opposing surfaces 5a and 6a, and be apart from boundaries 7 and 8 on both ends of the overlapping area in the z-axial direction. The bottom surface of the insulation layer 2 corresponds to the boundary 8, and the top surface of the insulation layer 4 corresponds to the boundary 7. The opposing surfaces 5a and 6a of the electrodes 5 and 6 are formed orthogonal to the surfaces of the insulation layers 2, 3, and 4. This achieves higher coherency of a ballistic carrier arrived at the electrodes.

Further, a not-shown insulator such as a semiconductor having a high dielectric breakdown strength is formed between the substrate 1 and the insulation layer 2, and between the electrodes 5 and 6. Thus, it is possible to restrain generating of ballistic electrons in the substrate 1, at the time of applying an electric field causing dielectric breakdown. The insulator is made of the same material that forms the substrate 1 or the insulation layers 2, 3, and 4.

The insulation layer 3 is made of a material having a higher dielectric breakdown strength than the insulation layers 2 and 4. Thus, a dielectric breakdown takes place in the insulation layers 2 and 4. Further, when the electrodes 5 and 6 are given a voltage that causes no dielectric breakdown in the insulation layer 3 which is formed between the opposing surfaces of the electrodes 5 and 6 and which has a high dielectric breakdown strength, the dielectric breakdown selectively takes place along the boundaries between the insulator 3 and the insulation layers 2 and 4, thereby forming ballistic carriers (electrons in this case) accelerated by a high voltage. Accordingly, at least two ballistic current paths are formed between the electrodes 5 and 6 facing each other. The substrate 1 and the insulation layers 2, 3, and 4 are made of: a Group IV semiconductor such as Si, Ge, or SiC; a Group III-V compound semiconductor represented by GaAs, GaP, InP, AlAs, GaN, InN, InSb, GaSb, or AN; a Group II-VI compound semiconductor such as ZnTe, ZeSe, ZnS, or ZnO; an oxide insulator such as ZnO, $Al_2O_3$, $SiO_2$, $TiO_2$, $CrO_2$, or $CeO_2$; or a nitride insulator such as SiN.

The insulation layer 3 is made of a substance such as ferrite or garnet whose relative magnetic permeability is 3 or more. Therefore, the insulation layer 3 causes the magnetic field to shift, and the shifting of the magnetic field shifts the phase of the carrier passing the current paths. This improves the efficiency of detecting an external electromagnetic field. Note that it may be the insulation layers 2 or 4 which are made of the substance whose relative magnetic permeability is 3 or more, instead of forming the insulation layer 3 with such a substance.

As an alternative form, the insulation layer 3 may be made of a substance having a relative dielectric constant of 4 or more. By doing so, the insulation layer 3 causes the magnetic field to shift, and the shifting of the magnetic field shifts the phase of the carrier passing the current paths. This improves the efficiency of detecting an external electromagnetic field. Note that it may be the insulation layers 2 or 4 which are made of the substance whose relative dielectric constant is 4 or more, instead of forming the insulation layer 3 with such a substance.

As mentioned above, the insulation layer 3 is made of a material whose dielectric breakdown strength is higher than those of the insulation layers 2 and 4. For example, when the insulation layers 2 and 4 are made of ZnO whose dielectric breakdown strength is 1 MV/cm, the voltage needed for dielectric breakdown is 7V. ZnO allows formation of an oxygen loss or a vacancy in the substance simply by varying the film forming conditions including: the composition of the material, the number of defects, amount of impurity or the like. This applies also to an oxide insulator or a nitride insulator (formation of nitrogen loss in the case of nitride insulator).

Note that all of the substrate 1 and the insulation layers 2, 3, and 4 are preferably semiconductor. This is because, a desirable crystal growth of semiconductor yields a flat insulation layer interface in the atomic level, and yields a linear current path. More specifically, the insulation layers 2, 3, and 4 are preferably an oxide insulator or a nitride insulator. This is because the use of the oxide insulator or the nitride insulator allows the formation of the insulation layers 2, 3, and 4 through an identical manufacturing process, and therefore is advantageous in terms of cost. The substrate 1 on the other hand may be made of any given material except for those listed as examples. Further, the insulation layers 2 and 4 do not necessarily have to be made of the same material.

Next, the following describes the respective layer thicknesses of the insulation layers 2, 3, and 4. As shown in FIG. 2, the thicknesses of the insulation layers 2, 3, and 4 are indicated by reference symbols of t1, t2, and t3, respectively. The insulation layers 2, 3, and 4 and the opposing electrodes 5 and 6 are formed as a multilayered structure on the substrate 1. Thus, by controlling the thickness of each layer, it is possible to control (i) a layer thickness t2 which is a distance between the two penetration paths for the ballistic electrons; and (ii) layer thicknesses t1 and t3 which are the penetration paths. Therefore, the area interposed between the two ballistic current paths can limited to a size of several hundred $nm^2$, and it is therefore possible to detect an electromagnetic field in a minute area of a nanosize level. The insulation layer 3 is formed so that the thickness t2 thereof is not more than a double (60 nm) of the mean free path (30 nm) of the metal electrons constituting the electrodes 5 and 6. This increases the coherency of the ballistic electrons having penetrated through the two paths, and improves the sensitivity of detecting an electromagnetic field. Note that it is possible to make the thickness t2 of the insulation layer 3 not more than the mean free path (30 nm) of the metal electrons so as to further improve the sensitivity of detecting an electromagnetic field. Further, the insulation layers 2 and 4 are formed so that the respective thicknesses t1 and t3 thereof are not more than the mean free path of the metal electrons This yields an improved coherency of the ballistic electrons as compared with a case where the thicknesses are thicker than the mean free path of the metal electrons.

The electrodes 5 and 6 are arranged so that the opposing surfaces 5a and 5b are inwardly positioned. The material of the electrodes 5 and 6 may be a conventional metal. However, since a substance with a high electric conductance is preferable, there is used Au, Ag, or Cu whose mean free path of electrons in the metal is approximately 30 to 40 nm. This yields a higher coherency of the ballistic electrons having arrived at the electrodes 5 and 6. Further, for the purpose of improving the adhesiveness of the electrodes 5 and 6, a not-shown adhesion layer made of Zn, Ti, Cr, Al or the like is formed between (i) the insulation layers 2, 3, and 4 and (ii) the electrodes 5 and 6; and between (i) the substrate 1 and (ii) the electrodes 5 and 6. The thickness of the adhesion layer is not more than the mean free path (approximately 10 nm) of the electrons in the metal constituting the adhesion layer, so that the coherency of the electrons is maintained. Further, in order to achieve a higher coherency of the electrons in the two ballistic current paths between the electrodes 5 and 6 facing each other, the widths W of the electrodes 5 and 6 is not more than the mean free path of the electrons in the metal used for the electrodes 5 and 6.

The interval L of the electrodes 5 and 6 is not more than 100 nm at the shortest portion. By arranging these electrodes 5 and 6 facing each other in a short distance, it is possible to cause a dielectric breakdown in the insulation layer 3 even with a low voltage, thereby generating ballistic electrons. More specifically, when the interval L is 70 nm, and when the insulation layers 2 and 4 are formed by using GaAs whose dielectric breakdown strength is 0.06 MV/cm, a voltage required for dielectric breakdown=interval L(70 nm)×dielectric breakdown voltage (0.06 MV/cm)=0.42V. When the insulation layers 2 and 4 are formed by using ZnO whose dielectric breakdown strength is 1 MV/cm, a voltage required for dielectric breakdown=interval L(70 nm)×dielectric breakdown voltage (1 MV/cm)=7V. Supposing that a current based on space-charge-limited conduction is acquired, the volt-ampere characteristic after the dielectric breakdown is $i \propto V^2/L^3$ according to Child-law. Here, it is assumed that: the mobility of electrons in the insulation layers 2 and 4 is 30 cm²/V·s; the interval L is 100 nm; a voltage applied is 10V; and that the relaxation time of electrons in the insulation layers 2 and 4 is 1 ps. Further, the speed of electrons=the mobility of electrons ×electric field, and the electric field=applied voltage/interval L. Thus, the following relation is derived: the electrons speed=(30 cm²/V·s)×(10V/100 nm)=3×10⁷ m/s. Since the mean free path=speed of electrons×relaxation time of electrons, the mean free path=(3×10⁷ m/s)×1 ps=300 nm. The mean free path may be somewhat reduced depending on a decrease in the relaxation time due to a defect in the insulators in the insulation layers 2 and 4, and distribution of the electric field between the electrodes 5 and 6. However, the interval L of 100 nm allows the electrons to penetrate between the electrodes while maintaining the coherency.

Although no illustration is provided, the entire surface of the electromagnetic field detecting element 10 is covered by an insulator whose dielectric breakdown strength is higher than those of the insulation layers 2 and 4, so as to prevent short-circuiting in a part other than the insulation layers 2 and 4 between the electrodes 5 and 6.

The following describes an operation of the electromagnetic field detecting element 10, along with AB effect and AC effect. FIG. 3 is a diagram for explaining the principle of the AB effect.

(AB Effect and Operation of Electromagnetic Field Detecting Element 10)

As shown in the upper diagram of FIG. 3, electrons rays e1 and e2 are emitted from an electron ray source 11. The electron rays e1 and e2 pass a gauge field where a vector potential A attributed to a magnetic field B is generated, and are detected by the electron ray detector 12. In this case, a detection amount (conductivity) F relative to the magnetic field B is periodically oscillated. This periodic oscillation of the detection amount F as shown in the lower diagram of FIG. 3 takes place, because the respective phases of the electron rays e1 and e2 are varied by the vector potential A, and the electron rays e1 and e2 respectively having different phases coheres in the electron ray detector 12. The oscillation period (magnetic field [T]) is: $B_0 = \Phi_0/S$. The magnetic flux quantum $\Phi_0$=h/2 e is a universal constant of 2.07×10⁻¹⁵ [Wb]m. S is an area surrounded by the paths of the electron rays e1 and e2. Here, it is supposed that L=70 nm, t2=30 nm, and each path of the ballistic electrons penetrates within a range of several nm nearby the interface of the insulation layer 3. Under these conditions, S=(30×70)nm², and equals the bit size corresponding to the storage surface density of 300 Gb/inch². In this case, the oscillation period $B_0$ [T] is 0.98[T]. Further, in a case where the bit size S=(25×25) nm² and corresponds to the storage surface density of 1 Tb/inch², the oscillation period $B_0$[T] is 3.3[T]. By subjecting a detection signal from the electromagnetic field detecting element 10 to a typical signal processing, the magnetic field resolution can be increased up to 1/1000 of the oscillation period $B_0$. Accordingly, when the bit size S corresponds to the storage surface density of 1 Tb/inch², the oscillation period $B_0$=3.3[T]. Therefore, the magnetic field resolution is approximately 3 [mT]. For example, in a case of magnetization 200 emu/cc as in a typical magnetic storage medium such as a Hard disk, the magnetic field generated by the magnetic storage medium is approximately 250 [mT]. Thus detection is sufficiently possible. Accordingly, the electromagnetic field detecting element 10 allows sufficient detection of a magnetic field having leaked from a magnetic storage medium, even if the storage surface density of the magnetic storage medium surpasses 1 Tb/inch².

Here, as an example, an electromagnetic field detecting element having almost the same configuration as that of the electromagnetic field detecting element 10 shown in FIG. 1 was manufactured, and a magnetic resistance effect of the electromagnetic field detecting element was measured. First, the following describes a method of manufacturing the electromagnetic field detecting element of the present example. On an Si substrate having thereon a thermally-oxidized film made of $SiO_2$, a ZnO layer of 30 nm in thickness, an $SiO_2$ layer of 40 nm in thickness, and another ZnO layer of 30 nm in thickness were formed in this order by spattering. On the ZnO layer of 30 nm in thickness, another $SiO_2$ layer (100 nm in thickness) to serve as a protection layer was further formed by spattering. After the formation of the multi-layered structure, a resist was patterned. Then, a portion not covered by the resist was dry-etched down to the depth of 250 nm, thereby forming layers which respectively correspond to the insulation layers 2, 3, and 4. After that, a Ti layer of 50 nm in thickness to become the adhesion layer, and an Au layer of 200 nm in thickness to become the electrodes were formed in this order on the layers corresponding to the insulation layers 2, 3 and 4, by means of electron beam vapor deposition. Then, the resist and the Ti and Au layers on the resist were removed by etching. Thus, an electromagnetic field detecting element having almost the same configuration as that of the electromagnetic field generating element 10 was manufactured. Note that the interval L between the electrodes was 1 μm, and the width W of each of the electrodes was 1 μm.

The electromagnetic field detecting element thus manufactured exhibited a favorable ohmic characteristic as shown in FIG. 21, when an IV curve between the electrodes of the same was measured, and ballistic electrons were generated even with a low voltage. That is, the electromagnetic field detecting element shown in the experiment result exhibited the ohmic characteristic, and therefore it is possible to reduce the resistance of the electromagnetic field detecting element thereby lowering the impedance. The electromagnetic field detecting element therefore allows improvement of a high frequency detection characteristic thereof, and a lower power consumption.

FIGS. 22 and 23 show measurement results of the magnet resistance of the electromagnetic field detecting element having actually been manufactured. The applied voltages between the electrodes were 10V and 0.5V. The longitudinal axis of FIGS. 22 and 23 indicates the current value, and the horizontal axis indicates the magnetic field. Note that the measurement was conducted at a room temperature (normal temperature). The external magnetic field generator and a hole sensor were used, and the measurement was conducted by a semiconductor parameter analyzer.

As shown in FIGS. 22 and 23, variation of at least 10⁷ (seven orders of magnitude) in the magnet resistance nearby magnetic fields of 0.2 T (2 kOe) and 0.25 T (2.5 kOe). From this result, it is obvious that there is manufactured an electromagnetic field detecting element whose magnet resistance exhibits extremely a large variation. The magnitude of the externally-applied magnetic field where a rapid variation of the magnet resistance takes place varies according to the shape of the electrodes, the distance between the electrodes, and a change in the multi-layered structure of the insulation layers. This is because the magnitude of the externally-applied magnetic field strongly depends on the coherency of the ballistic electrons. In principle, the electromagnetic field detecting element whose interval L between the electrodes or the width W of each electrode is 100 nm and which element has the same configuration as that of the above mentioned electromagnetic field detecting element is believed to yield the similar effect. Therefore, it is found that setting the distance L or the width W to 100 nm improves the coherency of the ballistic electrons, and realizes an electromagnetic field detecting element capable of performing more highly sensitive electromagnetic field detection.

(AC Effect and Operation of Electromagnetic Field Detecting Element 10)

The electromagnetic field detecting element 10 is capable of detecting a spin orbital interaction in the electron paths with an aid of the coherence effect of the electrons, and is capable of detecting an external electric field through the spin orbital interaction. The electromagnetic field detecting element 10 is therefore also capable of detecting static external electric field. This is utilization of AC effect which is specifically described below while comparing the AC effect with the AB effect. In AB effect, the magnetic field B is introduced as a vector potential A in Schrödinger equation of the following Formula (1).

[Formula 1]

$$\left[\frac{1}{2m}\left(\vec{p} + \frac{e}{c}\vec{A}\right)^2 + V(r)\right]\phi(r) = \epsilon\,\phi(r) \qquad (1)$$

When an electric field E is used, the Schrödinger equation is as shown in the following Formula (2).

[Formula 2]

$$\left[\frac{1}{2m}\left(\vec{p} - \vec{E}\times\vec{\mu}\right)^2\right]\phi(r) = \epsilon\,\phi(r) \qquad (2)$$

Here, μ is a magnetic moment of the electrons. According to Pauli matrix σ, the magnetic of the electrons is as shown in the following Formula (3). The $\mu_B$ is Bohr magneton.

[Formula 3]

$$\vec{\mu} = \mu_B\,\vec{\sigma}/2 \qquad (3)$$

Assuming that the spin orbital interaction by the electric field E and the magnetic moment (spin) of the electrons is expressed in the form of a vector potential $A_{so}$, the following Formula (4) is derived.

[Formula 4]

$$\vec{A}_{so} = \mu_B\,\vec{\sigma}\times\vec{E}/2 \qquad (4)$$

This means that, a phase change by the electric field E can be handled formally as is done in AB effect. In other words, the formula indicates that a phase change in the electrons and the coherency effect of the same occur due to the vector potential $A_{so}$ from electric field E and the magnetic moment μ of the electrons. This effect is called AC effect. When this effect takes place, a difference in the electric fields E applied to the two paths of the electrons causes a phase change. This is the distinction of the AC effect over the AB effect. However, the relation to the eclectic conductance is the same as AB effect.

Here, it is supposed that the insulation layer 3 which is an area interposed between the two electron ray paths is made of a material such as the material used for the substrate 1, which material (i) absorbs an external electromagnetic wave (including near field), (ii) excites the carrier, and then (iii) generates a pair of an electron and a hole When such a material is used, an application of an external electromagnetic wave generates a pair of an electron and a hole, and the generation of the pair varies the dielectric constant of the insulation layer 3, thereby varying the internal electric field of the same. This variation in the internal electric field is detected as a variation in a vector potential, by the electromagnetic field detecting element 10. Therefore, the electromagnetic field detecting element 10 is capable of detecting not only a static electromagnetic field, but also a dynamic external electromagnetic wave.

With the electromagnetic field detecting element 10 having the above described configuration, two ballistic current paths interposing therebetween the insulation layer 3 are formed between the electrodes 5 and 6, by applying to the area between the electrodes 5 and 6 an electric field whose magnitude causes dielectric breakdown in a part of the insulation area including the insulation layers 2, 3 and 4 which part is interposed between the electrodes 5 and 6, while causing no dielectric breakdown in the insulation layer 3. In short, the two ballistic current paths interposing the insulation layer 3 are formed at a room temperature. When there is an electromagnetic field in or nearby an area interposed between the two current paths, the vector potential derived from the electromagnetic field causes a phase change in ballistic carriers; i.e., carriers having coherency, passing the current paths. As a result, coherency (AB effect or AC effect) takes place due to the difference in the respective phases of the carriers having passed the two current paths. In other words, the electric conductance between the electrodes 5 and 6 varies due to the vector potential related to the external electromagnetic field. Therefore, it is possible to detect a static external electromagnetic field including an electromagnetic wave and a near field by measuring the electric characteristic of the electromagnetic field detecting element 10 at a room temperature. Further, by detecting the variation in the electromagnetic field, in or nearby the area interposed between the two current paths, as a variation in the electric conductance between the electrodes 5 and 6, it is possible to detect a dynamic external electromagnetic field at a room temperature. As described, the electromagnetic field detecting element 10 of the present embodiment allows highly efficient electromagnetic field detection using AB effect or AC effect at a room temperature. This electromagnetic field detecting element 10 is further advantageous in that the configuration of the element is relatively simple and that production of the element is easy.

Since the insulation layer 3 is interposed between the two insulation layers 2 and 4 contacting the insulation layer 3, the electric characteristic of the electromagnetic field detecting element 10 is stabilized, and more accurate external electromagnetic field detection is possible.

Further, since the insulation layers 2 and 4 contacts the opposing surfaces 5*a* and 6*a* of the electrodes 5 and 6, it is possible to increase the coherency of the ballistic carriers arrived at the electrodes.

Note that the both side surfaces of the insulation layers 2, 3, and 4 in the direction of the interval L do not necessarily have to physically contact the opposing surfaces 5*a* and 6*a* of the electrodes 5 and 6, provided that both side surfaces are close to the opposing surfaces 5*a* and 6*a* in such a manner as to form the two current paths at the time of dielectric breakdown. Note however that the coherency of the ballistic carriers arrived at the electrodes is higher when the both side surfaces of the insulation layers 2, 3, and 4 in the direction of the interval L contact the opposing surfaces 5a and 6a of the electrodes 5 and 6. Further, if the dielectric breakdown strength of the insulation layer 3 is greater than the air, the insulation layers 2 and 4 may be removed. In that case, layers of the air on both sides of the insulation layer 3 play the roles of the insulation layers 2 and 4.

<Alternative Form 1 of Embodiment 1>

Next, the following describes Alternative Form 1 of embodiment 1. The same symbols are given to parts that are identical to those described in Embodiment 1, and explanations therefor may be omitted below. FIG. 4 is a diagram showing Alternative Form 1 of the electromagnetic field detecting element of Embodiment 1, where (a) is a perspective view showing the configuration of the same and (b) is a top view of the same. As shown in FIG. 4(b), the electrodes 25 and 26 are connected to the insulation layers 22, 23, and 24 through the width $W_1$. The electrodes 25 and 26 are formed on the substrate 21, and the respective widths of the electrodes 25 and 26 are gradually increased so that respective portions of the electrodes 25 and 26 farther from the center are wider than those closer to the center. This is the distinction of the electromagnetic field detecting element of the present embodiment over the electromagnetic field detecting element 10 of Embodiment 1. Note that the present embodiment deals with a case where the respective widths of the electrodes 25 and 26 equal the widths of connecting portions where the electrodes 25 and 26 are connected to the insulation layers 22, 23, and 24.

The work and the effect of the present alternative form are similar to those of the electromagnetic field detecting element 10 of Embodiment 1. Further, it is possible to make the width $W^1$ smaller than the mean free path of the electrons of the electrodes 25 and 26. Therefore, it is possible to increase the coherency of the ballistic carriers arrived at the electrodes 25 and 26.

<Alternative Form 2 of Embodiment 1>

Next, the following describes Alternative Form 2 of Embodiment 1. The same symbols are given to parts that are identical to those described in Embodiment 1, and explanations therefor may be omitted below. FIG. 5 is a diagram showing the configuration of Alternative Form 2 of the electromagnetic field detecting element of Embodiment 1, viewed in a Y-axis direction. In the electromagnetic field detecting element 30, the insulation layer 33 has a length in a direction towards which the electrodes 35 and 36 face each other, which length differs from those of the insulation layers 32 and 34, and the insulation layers 32 and 34 are shorter than the insulation layer 33. In other words, an opposing surface of each of the electrodes 35 and 36 has a recessed portion. In the figure, reference symbols P1, Q1, P2, and Q2 are given to indicate corners of boundaries between the recessed portion and outside the recessed portion. Intervals P1-P2 and Q1-Q2 are shortest portions where the distance between the electrodes 35 and 36 are the shortest. These points are the distinctions of the electromagnetic field detecting element of the present embodiment over the electromagnetic field detecting element 10 of the Embodiment 1.

The work and the effect of the present alternative form are similar to those of the electromagnetic field detecting element 10 of Embodiment 1. Further, when an electric field is applied to the electrodes 25 and 26, the electric field and current are selectively converged at the portions, thereby efficiently generate the ballistic electrons.

<Embodiment 2>

Next, the following describes an electromagnetic field detecting circuit of Embodiment 2 according to the present invention. Members that are identical to those of Embodiment 1 are given symbols which are the same as those given to the members of Embodiment 1 except in that "4" is given in the tenth place. Explanation for those members may be omitted below.

FIG. 6 is a schematic diagram showing an electromagnetic field detecting circuit of Embodiment 2 in accordance with the present invention. FIG. 7 is a perspective configuration view specifically showing a relation between a magnetic field generating source and the electromagnetic field detecting element of the electromagnetic field detecting circuit of FIG. 6. As shown in FIG. 6, an electromagnetic field detecting circuit 100 of the present embodiment includes an electromagnetic field detecting sensor 101 and a phase controlling circuit 102.

The electromagnetic field detecting sensor 101 includes: an electromagnetic field detecting element 40; a metal thin line 103 serving as a magnetic field generating source which is provided nearby the electromagnetic field detecting element 40; a reference resistor 104 serially connected to the electromagnetic field detecting element 40; a constant voltage power source circuit 105 serially connected to the reference resistor 104; and a signal amplifier 106 connected in parallel to the reference resistor 104.

As shown in FIG. 7, a metal thin line 103 for generating a magnetic field B is arranged above the insulation layer 44 (in Z direction of FIG. 5) of the electromagnetic field detecting element 40. Although no illustration is provided, the metal thin line 103 is insulated from the electrodes 45 and 46 by an insulator. This metal thin line 103 is made of a highly conductive substance such as Au, Ag, or Cu. Further, the phase controlling circuit 102 is capable of controlling a current i fed to the metal thin line 103. Note that the magnetic field generating source in this case is the metal thin line 103; however, the magnetic field generating source is not limited to this and a magnetic coil or a magnetic material for example may be adopted.

When the metal thin line 103 is arranged above the insulation layer 44 as shown in FIG. 7, the magnetic field B is generated around the metal thin line 103 in response to the flow of the current i in the metal thin line 103. This magnetic field B is applied to the insulation layers 42, 43, and 44, in a direction substantially parallel to the Y direction of FIG. 7. This configuration is designed for the following reasons. Typically, a phase change takes place in ballistic electrons in addition to a desirable electromagnetic field to be measured. This phase change is attributed to the following causes: an electric field generated in the boundary of the electrodes 45 and 46, and that of the insulation layers 42, 43, and 44 of the electromagnetic field detecting element 40; or an exogenetic leak electromagnetic field. To cancel this phase change, an additional metal thin line 103 serving as a magnetic field generating source is provided, and another magnetic field B is applied to cause variation in the phase of the electrons penetrating the two insulation layers 42 and 44, thereby controlling an exogenetic phase shifting to improve the detection efficiency of the electromagnetic field.

The above mentioned metal thin line 103 for controlling phase shifting is arranged so as to control the phase difference of two electrons according to the exogenetic phase shifting.

The reference resistor 104 detects, in the form of voltage, a detection signal of the electromagnetic field detecting element 40. The constant voltage power source circuit 105 is capable of applying a desirable constant voltage to the electromagnetic field detecting element 40. The signal amplifier 106 is used for amplifying the detection signal.

The phase controlling circuit 102 includes: a lock-in detector 107; an output terminal 108; modulated signal transmitters 109 and 110; V/I converter 111 and 112; a switch 113; a hold circuit 114; a switch circuit 115; and a resistor 116.

The lock-in detector 107 is capable of selectively detecting signals and is serially connected to the signal amplifier 106 in the electromagnetic field detecting sensor 101. The output terminal 108 is for outputting the detection signal and is connected to the lock-in detector 107.

The modulated signal transmitter 109 is connected to the lock-in detector 107, and is for transmitting a signal of $f_0$ in frequency. The V/I converter 111 converts, into a current, a signal transmitted from the modulated signal transmitter 109. Similarly, the V/I converter 112 converts a signal given via a resistor 116 into a current. Further, the V/I converter 111 and 112 are connected to the metal thin line 103 in the electromagnetic field detecting sensor 101. The switch 113 is for turning on/off the electric connection between the modulated signal transmitter 109 and the V/I converter 111.

The modulated signal transmitter 110 is capable of transmitting to the hold circuit 114, a triangular wave whose frequency $f_1$ is lower than the frequency $f_0$. The hold circuit 114 is capable of transmitting a hold signal to the switch circuit 115. The switch circuit 115 is for controlling the modulated signal transmitter 110.

Next, the following describes an operation of the electromagnetic field detecting circuit 100. First, a desirable constant voltage is applied from the constant voltage power source circuit 105 to the electromagnetic field detecting element 40, via the reference resistor 104. At this time, the detection signal from the electromagnetic field detecting element 40 is detected in the form of voltage of the reference resistor 104. This detection signal is amplified by the signal amplifier 106, and is output to the output terminal 108 via the lock-in detector 107. To control the phase shifting, the phase controlling circuit 102 is used. Specifically, the switch 113 enters the on state, and a signal of the modulated signal transmitter 109 having the frequency of $f_0$ is converted into a current i by the V/I converter 111. The current i then flows into the metal thin line 103, thus generating a modulated magnetic field B. The magnetic field B thus generated is detected by the electromagnetic field detecting element 40, and a component of $f_0$ in the detection signal from the electromagnetic field detecting element 40 is amplified by the lock-in detector 107. The amplified detection signal is then input to the hold circuit 114, and the maximum value thereof is monitored. Next, from the modulated signal transmitter 110, the triangular wave whose frequency $f_1$ is lower than the frequency $f_0$ is input to the hold circuit 114. The triangular wave having been input is fed to the V/I converter 112 via the resistor 116, and is converted into the current i. A current derived from the signal from the lock-in detector 107 and a current corresponding to the triangular wave from the V/I converter 112 are overlapped each other and flow in the metal thin line 103. Thus, a magnetic field B c is generated from the metal thin line 103. The hold circuit 114 then detects a phase whereby the detection signal from the lock-in detector 107 is maximized in a cycle $1/f_1$, and hold the voltage value of the phase. The switch circuit 115 turns off the modulated signal transmitter 110, in response to the hold signal from the hold circuit 114. The hold signal from the hold circuit 114 is converted into the current i by the V/I converter 112, and the phase shifted magnetic field $B_p$ (magnetic field at completion of phase control) corresponding to the hold signal is generated from the metal thin line 103. Thus, the detection sensitivity of the electromagnetic field generating element 40 is maximized at the time of external electromagnetic field detection.

With the electromagnetic field detecting circuit 100 of the present embodiment, the magnetic field generated from the magnetic field generating source 103 varies the vector potential, thereby allowing shifting of the phase of the carriers passing the current paths. It is therefore possible to improve the efficiency of detecting the external electromagnetic field by the electromagnetic field detecting element 40. Further, with the use of the phase controlling critic 102, the detection sensitivity of the electromagnetic field detecting element 40 is maximized. This however is described later more in detail with reference to FIG. 19.

<Embodiment 3>

Next, the following describes an electromagnetic field detecting circuit of Embodiment 3, according to the present invention. Members that are identical to those of Embodiment 1 are given symbols which are the same as those given to the members of Embodiment 1 except in that "5" is given in the tenth place. Explanation for those members may be omitted below. Further, the parts of the present embodiment given the reference numerals 201, 202, 204 to 210, and 213 to 216 respectively correspond to the parts of Embodiment 2 with the reference numerals 101, 102, 104 to 110, and 113 to 116, and therefore explanations for these part may be omitted.

FIG. 8 is a schematic diagram showing an electromagnetic field detecting circuit of Embodiment 3 in accordance with the present invention. FIG. 9 is a perspective configuration view specifically showing a relation between an electric field generating source and the electromagnetic field detecting element of the electromagnetic field detecting circuit of FIG. 8. As shown in FIG. 8, an electromagnetic field detecting circuit 200 of the present embodiment includes an electromagnetic field detecting sensor 201 and a phase controlling circuit 202.

The configuration of the electromagnetic field detecting sensor 201 is the same as the electromagnetic field detecting sensor 101 of Embodiment 1, except in that a metal plate 203 serving as an electric field generating source is adopted in place of the magnetic field generating source. Specifically, shown in FIG. 9, a metal plate 203 serving as an electric field generating source, for generating an electric field E, is arranged above the insulation layer 54 (in Z direction of FIG. 9) of the electromagnetic field detecting element 40. Although no illustration is provided, the metal plate 203 is insulated from the electrodes 55 and 56 by an insulator. This metal plate 203 is made of a highly conductive substance such as Au, Ag, or Cu. Further, the phase controlling circuit 202 is capable of controlling a voltage V fed to the metal plate 203.

When the metal plate 203 is arranged above the insulation layer 54 as shown in FIG. 9, the electric field E is generated around the metal plate 203 in response to application of the voltage V to the metal plate 203. This electric field E is applied to the insulation layers 52, 53, and 54, in a direction substantially parallel to the Z direction of FIG. 9. The applied electric field E causes variation in the band structure of the insulation layers 52, 53, and 54 through the spin orbital interaction of the insulation layers 52, 53, and 54, thereby varying the vector potential. This configuration is designed for the following reasons. Typically, a phase change takes place in ballistic electrons in addition to a desirable electromagnetic field to be measured. This phase change is attributed to the following causes: an electric field generated in the boundary of the electrodes 55 and 56, and that of the insulation layers 52, 53, and 54 of the electromagnetic field detecting element 50; or an exogenetic leak electromagnetic field. To cancel this phase change, an additional metal thin line 203 is provided, and another electric field E is applied to cause variation in the phase of the electrons penetrating the two insulation layers 52 and 54, thereby controlling an exogenetic phase shifting to improve the detection efficiency of the electromagnetic field.

The above mentioned metal thin line 203 for controlling phase shifting is arranged so as to control the phase difference of two electrons according to the exogenetic phase shifting.

The configuration of the phase controlling circuit 202 is the same as the phase controlling circuit 102 of Embodiment 1, except in that a voltage generating circuit 211 which applies a voltage V to the metal plate 203 is adopted in place of the V/I converter 111, 112.

Next, the following describes an operation of the electromagnetic field detecting circuit 200. First, a desirable constant voltage is applied from the constant voltage power source circuit 205 to the electromagnetic field detecting element 50, via the reference resistor 204. At this time, the detection signal from the electromagnetic field detecting element 50 is detected in the form of voltage of the reference resistor 204. This detection signal is amplified by the signal amplifier 206, and is output to the output terminal 208 via the lock-in detector 207. To control the phase shifting, the phase controlling circuit 202 is used. Specifically, the switch 213 enters the on state, and a signal of the modulated signal transmitter 209 having the frequency of $f_0$ is converted into a voltage V by the V/I converter 211. The voltage V is then applied to the metal plate 203, thus generating a modulated electric field E. The electric field E thus generated is detected by the electromagnetic field detecting element 50, and a component of $f_0$ in the detection signal from the electromagnetic field detecting element 50 is amplified by the lock-in detector 207. The amplified detection signal is then input to the hold circuit 214, and the maximum value thereof is monitored. Next, from the modulated signal transmitter 210, the triangular wave whose frequency $f_1$ is lower than the frequency $f_0$ is input to the hold circuit 214. The triangular wave having been input is fed to the voltage generating circuit 211 via the resistor 216, and is converted into the voltage V. In the metal plate 203, a voltage V corresponding to a signal in which the signal from the lock-in detector 207 and the triangular wave from the hold circuit 214 are overlapped each other. Thus, an electric field $E_c$ is generated from the metal plate 203. The hold circuit 214 then detects a phase whereby the detection signal from the lock-in detector 207 is maximized in a cycle $1/f_1$, and hold the voltage value of the phase. The switch circuit 215 turns off the modulated signal transmitter 210, in response to the hold signal from the hold circuit 214. The hold signal from the hold circuit 214 is converted into the voltage V by the voltage generating circuit 211, and the phase shifted electric field $E_p$ corresponding to the hold signal is generated from the metal plate 203. Thus, the detection sensitivity of the electromagnetic field generating element 50 is maximized at the time of external electromagnetic field detection.

With the electromagnetic field detecting circuit 200 of the present embodiment, the electric field generated from the metal plate 203 causes variation in the band structure in a substance through spin orbital interaction in the insulation layer 53 or the substance in the insulation area, thereby varying the phase of carriers passing the current paths. It is therefore possible to improve the efficiency of detecting the external electromagnetic field by the electromagnetic field detection element 50. Further, with the use of the phase controlling circuit 202, the detection sensitivity of the electromagnetic field detecting element 50 is maximized.

<Embodiment 4>

Next, the following describes an electromagnetic field detecting circuit of Embodiment 4, according to the present invention. Members that are identical to those of Embodiment 1 are given symbols which are the same as those given to the members of Embodiment 1 except in that "6" is given in the tenth place. Explanation for those members may be omitted below. Further, the parts of the present embodiment given the reference numerals 301, 302, 304 to 306 respectively correspond to the parts of Embodiment 2 with the reference numerals 101, 102, 104 to 110, and therefore explanations for these part may be omitted.

FIG. 10 is a schematic diagram showing an electromagnetic field detecting circuit of Embodiment 4 in accordance with the present invention. FIG. 11 is a perspective configuration view specifically showing a relation between a semiconductor laser element and the electromagnetic field detecting element of the electromagnetic field detecting circuit of FIG. 10. As shown in FIG. 10, the electromagnetic field detecting circuit 300 of the present embodiment includes an electromagnetic field detecting sensor 301, and a phase controlling circuit 302.

The configuration of the electromagnetic field detecting sensor 301 is the same as electromagnetic field detecting sensor 101 of Embodiment 1, except in that the electromagnetic field detecting sensor 301 includes, in place of the magnetic field generating source, a semiconductor laser element 303 serving as an electromagnetic field generating source; a photodetecting element 317; a laser drive circuit 318; and a laser drive current output circuit 319.

The semiconductor laser element 303 is connected to an input terminal 320 for receiving power from a drive power source. The semiconductor laser element 303 includes: a laser beam oscillating section 303c, and electrodes 303d and 303e each for injecting a current into the laser beam oscillating section 303c. The laser beam oscillating section 303c includes distributed Bragg reflectors 303a and 303b for realizing laser beam oscillation. The distributed Bragg reflectors 303a and 303b are respectively arranged nearby two ends of the laser beam oscillating section 303c in a laser beam oscillating direction (the Y direction in FIG. 11). As shown in FIG. 11, the laser beam oscillating section 303c is formed on a substrate 61 and is disposed between two electrodes 65 and 66 so that a laser beam oscillated from the active region 303 of the semiconductor laser element 303 propagates to the insulation layers 62, 63, and 64 of an electromagnetic field detecting element 60. The electrode 303d is formed in a position, on the substrate 61, which is nearby a side surface of the laser beam oscillating section 303c, and is extended along the laser beam oscillating section 303. The electrode 303e is formed on the top surface of the laser beam oscillating section 303c. Although no illustration is provided, an insulation coating is provided between the electromagnetic field detecting element 60 and the semiconductor laser element 303, so as to maintain insulation from the electrodes 65 and 66, and the electrodes 303d and 303e. Note that, instead of the distributed Bragg reflector 303a and 303b, a reflection film may be formed on each cut-out end surface (surface at each end of the semiconductor laser element 303 in the Y-direction of FIG. 11).

The laser beam oscillated from the semiconductor laser element 303 excites carriers in a part of or the entire insulation layers 62, 63, and 64, thereby generating electron hole pairs. This generation of electron hole pairs causes dielectric breakdown of the insulation layers 62 and 64. Therefore, it is possible to reduce the electric field to be applied to the electrode 65 and 66. Further, the carrier excitation attributed to the laser beam oscillated from the semiconductor laser element 303 causes variation in the dielectric constant in a part of or the entire insulation layers 62, 63, and 64, thereby varying the electric fields inside the insulation layers 62, 63, and 64.

Therefore, the respective phases of the ballistic electrons vary according to the intensity of the laser beam, and are expressed in the form of variation in the mobility of the electrons. It is therefore possible to monitor the power of the laser beam generated by the semiconductor laser element 303, and to control the phases of the electrons by the intensity of the laser beam.

The parts of the electromagnetic field detecting sensor 301 given the reference numerals 307 to 311, and 313 to 316 are respectively the same as the parts of the electromagnetic field detecting sensor 201 of Embodiment 2, with the reference numerals 207 to 211, and 213 to 216, and therefore explanations for these parts may be omitted below.

Next, the following describes an operation of the electromagnetic field detecting circuit 300. First, a desirable constant voltage is applied from a constant voltage power source circuit 305 to the electromagnetic field detecting element 60, via the reference resistor 304. At this time, the detection signal from the electromagnetic field detecting element 60 is detected in the form of voltage of the reference resistor 304. This detection signal is amplified by the signal amplifier 306, and is output to the output terminal 308 via the lock-in detector 307. To control the phase shifting, the phase controlling circuit 302 is used. Specifically, the switch 313 enters the on state, and a signal of the modulated signal transmitter 309 having the frequency of $f_0$ is converted into a voltage V by the voltage generating circuit 311. The voltage V is then input to the laser drive circuit 318. According to the voltage V input, the laser drive current output circuit 319 feeds a current to the semiconductor laser element 303. Light emitted from the semiconductor laser element 303 is detected by the photodetecting element 317, and the laser power is converted into a current. The current is then input to the laser driver circuit 318. With the current from the photodetecting element 317, feedback to the laser drive circuit 318 is performed so as to achieve a desirable laser power corresponding to a potential V of the voltage generating circuit 311. Where the period taken for stabilizing the laser power is $t_s$, the frequency $f_0$ is adjusted so as to be sufficiently lower than $1/t_s$. The light emission from the semiconductor laser element 303 is detected by the electromagnetic field detecting element 60, and a component of $f_0$ in the detection signal is amplified by the lock-in detector 307. The amplified detection signal is then input to the hold circuit 314, and the maximum value thereof is monitored. Next, from the modulated signal transmitter 310, the triangular wave whose frequency $f_1$ is lower than the frequency $f_0$ is input to the hold circuit 314. The triangular wave having been input is fed to the voltage generating circuit 311 via the resistor 316, and is converted into the voltage V. Thus, to the semiconductor laser element 303, there is applied the voltage V corresponding to a signal in which the signal from the lock-in detector 307 and the triangular wave from the hold circuit 314 are overlapped each other. Thus, a laser beam is generated from the semiconductor laser element 303. The hold circuit 314 then detects a phase whereby the detection signal from the lock-in detector 207 is maximized in a cycle $1/f_1$, and hold the voltage value of the phase. The switch circuit 315 turns off the modulated signal transmitter 310, in response to the hold signal from the hold circuit 314. The hold signal from the hold circuit 314 is converted into the voltage V by the voltage generating circuit 311, and the phase shifted electric laser beam corresponding to the hold signal is generated from the semiconductor laser element 303. Thus, the detection sensitivity of the electromagnetic field generating element 60 is maximized at the time of external electromagnetic field detection.

With the electromagnetic field detecting circuit 300 of the present embodiment, the laser beam from the semiconductor laser element 303 varies the vector potential, thereby causing shifting of the phase of carriers passing the current paths. This allows monitoring of the power of the laser beam from the semiconductor laser element 303. Further, when the laser beam from the semiconductor laser element 303 excites the carrier in the insulated region thus generating the electron hole pairs, it is possible to cause dielectric breakdown in the insulated region at a low voltage. It is therefore possible to improve the efficiency of detecting the external electromagnetic field by the electromagnetic field detection element 60. Further, with the use of the phase controlling circuit 302, the detection sensitivity of the electromagnetic field detecting element 60 is maximized.

<Alternative Form 1 of Embodiment 4>

Next, the following describes Alternative Form 1 of Embodiment 4. In this alternative form, no photodetecting element is used, and a detection signal of an electromagnetic field detecting element is used to perform control of the laser power and phase control associated with the detection of the laser beam. Members that are identical to those of Embodiment 1 are given symbols which are the same as those given to the members of Embodiment 1 except in that "7" is given in the tenth place, and explanation for these members may be omitted here. Further, the parts of the present embodiment given the reference numerals 401, 402, and 404 to 406 respectively correspond to the parts of Embodiment 2 with the reference numerals 101, 102, and 104 to 106, and therefore explanations for these part may be omitted. FIG. 12 is a schematic diagram showing an alternative form of the electromagnetic field detecting circuit of Embodiment 4, according to the present invention. The electromagnetic field detecting circuit 400 of the present alternative form includes an electromagnetic field detecting sensor 401 and a phase controlling circuit 402.

The configuration of the electromagnetic field detecting sensor 401 is almost the same as the electromagnetic field detecting sensor 301 of Embodiment 4, except in that the photodetecting element 317 is not adopted.

The configuration of the phase controlling circuit is almost the same as the phase controlling circuit of Embodiment 4, except in that: the hold circuit 414 and the laser driver circuit 318 are serially connected to each other; and the phase controlling circuit mentioned in Embodiment 2 or 3 (not shown) is adopted, and the detection sensitivity of the electromagnetic field generating element 70 is maximized by the phase controlling circuit prior to the detection of a laser beam. The parts of the electromagnetic field detecting sensor 401 with the reference numerals 407 to 411, and 413 to 416 are respectively the same as the parts of the electromagnetic field detecting sensor 201 of Embodiment 2 with the reference numerals 207 to 211 and to 216.

Next, the following describes laser power control performed by the semiconductor laser element 403. First, a desirable constant voltage is applied from the constant voltage power source circuit 405 to the electromagnetic field detecting element 70, via the reference resistor 404. At this point, the detection signal from the electromagnetic field detecting element 70 is detected in the form of voltage in the reference resistor 404. This detection signal is then amplified by the signal amplifier 406, and is output to the output terminal 408 via the lock-in detector 407. Meanwhile, from the input terminal 421, a voltage V corresponding to the desirable laser power is input to the laser drive circuit 418. According to this input voltage V, the laser drive current output circuit 419 feeds a current to the semiconductor laser element 403 connected to the input terminal 420 of the drive power source. The light emission from the semiconductor laser element 403 is detected by the electromagnetic field detecting element 70, and the detection signal is fed to the voltage generating circuit 411 via the hold circuit 414. The detection signal is then converted into a desirable voltage V in the voltage generating circuit 411, and is input to the laser drive circuit 418. At this point, the laser drive circuit 418 outputs a signal to the hold circuit 414 so that the detection signal from the electromagnetic field detecting element 70 is fed as it is to the laser drive circuit 418. In the laser drive circuit 418, a signal indicative of deviation is calculated from a signal from the input terminal 421 and the detection signal from the electromagnetic field detecting element 70. This deviation signal is amplified and then the amplified signal is input to the laser drive current output circuit 419. That way feedback is performed until a set laser power corresponding to the signal from the input terminal 421 is achieved. After the completion of the laser power control, the laser drive circuit 418 stops outputting signals to the hold circuit 414. Through the above procedure, there is realized laser power control using the electromagnetic field detecting element 70, the laser power control capable of outputting a desirable laser power.

To perform a phase shift control after the laser power control, the phase controlling circuit 402 is used. Specifically, the switch 413 enters the on state, and a signal of the modulated signal transmitter 409 having the frequency of $f_0$ is converted into a desirable voltage V by the voltage generating circuit 411. The voltage V is then applied to the laser drive circuit 418. According to the voltage V input, the laser drive current output circuit 419 feeds a current to the semiconductor laser element 403. Here, the semiconductor laser element is given a current, whose value is modulated into a value larger than a threshold current of the semiconductor laser element 403, so as to cause laser light oscillation. Light emitted from the semiconductor laser element 403 is detected by the electromagnetic field detecting element 70, and the laser power is converted into a current. The current is then input to the laser driver circuit 418. With the signal from the photodetecting element 417, feedback to the laser drive circuit 318 is performed so as to achieve a desirable laser power. Where the period taken for stabilizing the laser power is $t_s$, the frequency $f_0$ is adjusted so as to be sufficiently lower than $1/t_s$. The light emission from the semiconductor laser element 403 is detected by the electromagnetic field detecting element 70, and a component of $f_0$ in the detection signal is amplified by the lock-in detector 407. The amplified detection signal is then input to the hold circuit 414, and the maximum value thereof is monitored. Next, from the modulated signal transmitter 410, the triangular wave whose frequency $f_1$ is lower than the frequency $f_0$ is input to the hold circuit 414. The triangular wave having been input is fed to the voltage generating circuit 411 via the resistor 416, and is converted into the voltage V. Thus, to the semiconductor laser element 403, there is applied the voltage V corresponding to a signal in which the signal from the lock-in detector 407 and the triangular wave from the hold circuit 414 are overlapped each other. Thus, a laser beam is generated from the semiconductor laser element 403. The hold circuit 414 then detects a phase whereby the detection signal from the lock-in detector 407 is maximized in a cycle $1/f_1$, and hold the voltage value of the phase. The switch circuit 415 turns off the modulated signal transmitter 410, in response to the hold signal from the hold circuit 414. The hold signal from the hold circuit 414 is converted into the voltage V by the voltage generating circuit 411, and the phase shifted electric laser beam corresponding to the hold signal is generated from the semiconductor laser element 403. Thus, the detection sensitivity of the electromagnetic field generating element 70 is maximized at the time of external electromagnetic field detection.

With the present alternative form, the laser light from the semiconductor laser element 403 causes variation in the vector potential, thereby allowing shifting the phases of the carriers passing the current paths. As a result, the electromagnetic field detecting element 70 is able to detect an external electromagnetic field with higher detection efficiency. Further, with the use of the phase controlling circuit 402, the detection sensitivity of the electromagnetic field detecting element 70 is maximized. Further, since no photodetecting element is adopted, the configuration is simplified compared to that of the electromagnetic field detecting circuit 300.

<Embodiment 5>

Next, the following describes a magnetic recording/reproducing head of Embodiment 5, according to the present invention. Members that are identical to those of Embodiment 1 are given symbols which are the same as those given to the members of Embodiment 1 except in that "8" is given in the tenth place.

FIG. 13 is a front configuration view showing the magnetic recording/reproducing head of Embodiment 5, according to the present invention. As shown in FIG. 13, the magnetic recording/reproducing head 500 includes: an electromagnetic field generating element 501 formed on a substrate 81; and an electromagnetic field detecting element 80 formed on an electromagnetic field generating element 501 interposing therebetween an insulation layer 502.

The electromagnetic field generating element 501 includes: a pair of electrodes 504 and 505 formed so as to interpose therebetween an insulator 503; a thin conductive layer 506 formed so as to stretch over the electrodes 504 and 505; and a semiconductor laser element arranged as is the case of Embodiment 4 on the substrate 81 in the Y direction, the semiconductor laser element having the same configuration as that of Embodiment 4. Note that the illustration of the semiconductor laser element is omitted in FIG. 13, for the reason that it is located on the backside of each element. The electromagnetic field detecting element 80 includes: insulation layers 82, 83, and 84; and electrodes 85 and 86.

The electrodes 504 and 505 and the conductive layer 506 are made of highly conductive metal or carbon nanotubes. Particularly, in consideration of a high frequency response characteristic, non magnetic metal such as Au, Pt, Cu, Al, Ti, W, Ir, or Pd is used. Further, a not shown adhesion layer made of Zn, Ti, Cr, or Al is formed at the interfaces between the electrodes 504 and 505 and conductive layer 506, and interfaces between the electrodes 504 and 505 and the conductive layer 506.

$A_w$ and $A_h$ in FIG. 13 respectively indicate the width and height of an active area of the not shown semiconductor laser element. A laser beam is propagated in an area surrounded by the dotted line. The electrodes 504 and 505 has therebetween a gap G, and the gap G is filled with the insulator 503. G is 200 nm or less and the width (length in the Y-direction of FIG. 13) of the conductive layer 506 is 400 nm or less. Further, when the conductive layer 506 is made of Au, the conductive layer 506 is formed so that its cross section (cut surface vertical to the X axis) is larger than approximately 6400 nm$^2$. This is because, with a cross section area of smaller than 6400 nm$^2$, the conductive layer will be molten by a Jour heat generated when a current i flows. Note that, when other material is adopted, the cross section area is equal to or larger than the case of adopting Au.

Next, with reference to FIG. 14, the following describes how an electromagnetic field is generated by the electromagnetic field generating element 501. In the mean time, the following also describes an operation of the electromagnetic field detecting element 80. When the current i is fed from the electrode 505 to the electrode 504 via the conductive layer 506, a magnetic field B is generated in a part of the conductive layer 506 corresponding to the gap G. Further, when the potential V is applied to the conductive layer 506, an electric field is generated around the conductive layer 506. Further, when a laser beam is irradiated from the semiconductor laser element, a near field NF is generated in a part of the conductive layer 506 corresponding to the gap G. Here, the following describes how the near field is generated. When an electromagnetic wave that falls within a range from the near-infrared to the visible light region is applied to the interface between metal (conductive layer 506 in this specification) and a dielectric substance (insulation layers 502 and 503 in this specification), a compression wave attributed to the charge in the metal is generated in the interface, and couples with the electromagnetic wave applied. During this state, the electromagnetic wave is confined within the interface, and is not able to propagate in a direction perpendicular to the interface. Such a state is referred to as "a near field is generated". The near field is a collective term referring to an evanescent wave, a surface plasmon, a surface plasmon polariton, a local surface plasmon polariton or the like. Accordingly, with the magnetic field B, electric field E, near field NF from the electromagnetic field generating element 501, it is possible to control the phase difference in two ballistic electrons in the electromagnetic field detecting element 80. Similarly to the carrier excitation in the insulation layers 82, 83, and 84 using the laser beam, the dielectric constants of the insulation layers 82, 83, and 84 are partially or entirely varied in the electromagnetic field detecting element 80, through generation of electron hole pairs associated with a carrier excitation using the near field NF. Variation of the electric field inside the insulation layers 82, 83, and 84 causes variation in the phases of the ballistic electrons, and is expressed in the form of variation in the electric conductance. Accordingly, with the electromagnetic field detecting element 80, it is possible to monitor the power of the near field NF generated from the electromagnetic field generating element 501. Note that the laser beam may be applied to only one of the insulation layers 82, 83, and 84. Further, as long as the insulation layer 503 is made of a transparent material, it is possible to restrain attenuation of the near field in the interface between the insulation layer 503 and the metal made conductive layer 506.

With the present embodiment, electromagnetic field information recorded on the information storage medium by the electromagnetic field generating element 501 is detected with a high sensitivity with the electromagnetic field detecting element 80. Accordingly, for example, there is provided a magnetic recording/reproducing head 500 capable of recording/reproducing electromagnetic field information supporting a high storage surface density of over 1 Tb/inch$^2$. Further, with the use of the electromagnetic field generating element 501, it is possible to perform phase control in the electromagnetic field detecting element 80 by an electric field E, a magnetic field B, or a near field NF generated from the electromagnetic field generating element 501. It is therefore possible to improve the sensitivity of the electromagnetic field detecting element 80 for detecting the a magnetic field B, or a near field NF.

Note that the phase control in the present embodiment is realized with a use of the phase controlling circuit of Embodiment 2 or 4, or with a combination of the phase controlling circuit of these embodiments.

<Alternative Form of Embodiment 5>

Next, the following describes an alternative form of the magnetic recording/reproducing head of Embodiment 5. Members that are identical to those of Embodiment 1 are given symbols which are the same as those given to the members of Embodiment 1 except in that "9" is given in the tenth place.

FIG. 15 is a front configuration view showing the alternative form of the magnetic recording/reproducing head of Embodiment 5, according to the present invention. As shown in FIG. 15, the magnetic recording/reproducing head 600 includes: an electromagnetic field detecting element 90 formed on a substrate 91; and an electromagnetic field generating element 601 formed on the electromagnetic field detecting element 90 so as to interpose therebetween an insulation layer 602.

The electromagnetic field detecting element 90 includes: insulation layers 92, 83, and 84 formed on the substrate 91; and electrodes 85 and 86. The electromagnetic field generating element 601 includes: a conductive layer 606 formed on the insulation layer 602; electrodes 604 and 605 formed on the conductive layer 606 and insulation layer 602 so as to interpose therebetween the insulator 603; and a semiconductor laser element arranged as is the case of Embodiment 4 on the substrate 91 in the Y direction, the semiconductor laser element having the same configuration as that of Embodiment 4. Note that the illustration of the semiconductor laser element is omitted in FIG. 15, for the reason that it is located on the backside of each element.

The above configuration yields the same effects as those obtain from Embodiment 5. Further, the above configuration allows formation of the electromagnetic field detecting element 90 on the substrate 91 with a use of a crystal substrate. Therefore, when each of the insulation layers 92, 93, and 94 are made of crystalline substance, the crystallinity is improved. This leads to an effect such as an increase in the dielectric breakdown strength, or an improvement of conductivity of the electrons.

<Embodiment 6>

Next, the following describes an information recording/reproducing device of Embodiment 6, according to the present invention. FIG. 16 is a perspective diagram showing a configuration of a main part of the information recording/reproducing device of Embodiment 6, according to the present invention. FIG. 17 is an enlarged perspective diagram showing a part nearby an information recording/reproducing head of the information recording/reproducing device shown in FIG. 16. FIG. 18 is a diagram for explaining an operation of recording/reproducing magnetic field information, which is performed by the information recording/reproducing head of the information recording/reproducing device of FIG. 16 with respect to an information storage medium.

An information recording/reproducing device 700 includes: an arm 702 moved by an actuator 701 serving as a moving means; a slider 703 supported by the arm 702; an information recording/reproducing head 800 attached to the slider 703; and an information storage medium 704 in/from which electromagnetic field information is recorded/reproduced with a use of the information recording/reproducing head 800.

The information recording/reproducing head 800 as shown in FIG. 17 and FIG. 18 has the same configuration as the information recording/reproducing head 500 of Embodiment 5, and includes: a semiconductor laser element 802 and an electromagnetic field generating element 803 each disposed on a substrate 806; an electromagnetic field detecting element 804 disposed on the electromagnetic field generating element 803, interposing insulation layer 805 between the an electromagnetic field detecting element 804 and the electromagnetic field generating element 803. The electromagnetic field generating element 803 includes electrodes 803a and 803b which are electrically connected via a conductive layer 803c. The semiconductor laser element 802 includes electrodes 802a and 802b. The electromagnetic field detecting element 804 includes electrodes 804a and 804b. Each of the electrodes 803a and 803b, electrodes 802a and 802b, and electrodes 804a and 804b are respectively connected to thin wire of flexible cables. The electromagnetic field detecting element 804 includes insulation layers 804c, 804d, and 804e configured as in the case of the information recording/reproducing head 500 of Embodiment 5.

As shown in FIG. 17, the slider 703 has an air bearing structure 801 which is disposed at a lower part of the slider 703. This air bearing structure 801 slides above a storage surface 704a of the rotating information storage medium 704. The distance (flying height) between the information recording/reproducing head 800 and the storage surface 704a is set not more than 100 nm. Further, the slider 703 scans a storage track on the information storage medium 704 with an aid of the actuator 701 serving as the moving means.

The information storage medium 704 is a typical magnetic storage medium used in a hard disk drive. Examples of such an information storage medium 704 includes: a CoCrPt-based magnetic storage medium, a rare earth transition metal magnetic storage medium, a FePt-based magnetic storage medium, or the like. Further, the information storage medium 704 may be constituted by an antiferromagnetic substance such as RhFe or the like. Further, the information storage medium 704 may be a medium in which a heat-caused phase change takes place.

Next, the following describes, with reference to FIG. 18, how the information recording/reproducing head 800 of the present embodiment records/reproduces information on/from the information storage medium 704.

First described is the principle of the recording operation. As is already mentioned in Embodiment 5, a laser beam from the semiconductor laser element 802 of the information recording/reproducing head 800 is applied to the conductive layer 803c of the electromagnetic field generating element 803, thereby generating a near field around the gap. The generated near field locally heats the information storage medium 704. If the information storage medium 704 is constituted by a magnetic material having a large coercive force, the local heating reduces the coercive force in a portion of the information storage medium subjected to the local heating. At the same time, a current i is fed to the conductive layer 803 to apply a magnetic field B which equals or surpasses the coercive force of the information storage medium 704, thereby performing a near field assisted magnetic recording. Further, when the information storage medium 704 moves leftward on FIG. 18 relative to the electromagnetic field generating element 803, a near field assisted vertical magnetic recording is performed. To the contrary, when the information storage medium 704 moves rightward on the figure relative to the electromagnetic field generating element 803, a near field assisted slanted magnetic recording is performed. Further, a conventional magnetic recording may be performed, if the generated magnetic field is stronger than the coercive force of the information storage medium 704 at a room temperature. When the information storage medium 704 is constituted by a phase change medium, a phase change recording is performed by generating a near field to locally heat the information storage medium. As mentioned above, information is recorded on the information storage medium 704 with the electromagnetic field generating element 803.

Next described is the principle of the reproducing operation. A desirable high electric field is applied to the electromagnetic field detecting element 804 to generate paths for two ballistic electrons. FIG. 19 is an explanatory diagram showing electromagnetic field detection performed when a magnetic record bit 704c passes nearby an electromagnetic field detecting element 804, the magnetic record bit 704c being recorded on an information recording track 704b of the information storage medium 704 shown in FIG. 18. FIG. 19 shows a case where the information storage medium is a vertical magnetic storage medium. In the information recording track 704b, magnetic record bits 704c, which are perpendicular to the surface of FIG. 19, are aligned so that magnetization directions of adjacent magnetic record bits 704c are antiparallel. Further, the vector potential of each magnetic record bit 704c is indicated by the dotted arrows. In the uppermost magnetic record bit 704c, the magnetization is directed from the surface of the figure towards front, and a counter-clockwise vector potential is formed. A phase change takes place between two ballistic electrons, when the traveling direction of a path e1 for a ballistic electron is opposite to the direction of the vector potential while the traveling direction of a path e2 is the same as the vector potential, as shown in the left half of FIG. 19(A). The phase difference between the two ballistic electrons is $2\pi\Delta\Phi/\Phi_0$ where: $\Phi_0$ is a magnetic flux quantum; $\Delta\Phi$ is a magnetic flux amount in a region between the paths for the two ballistic electrons. The electric conductance F of the electromagnetic field detecting element 800 is reduced by an amount of the phase difference (See the middle diagram of FIG. 19(A)).

On the other hand, no phase change will take place between two ballistic electrons, when the traveling directions of the paths e1 and e2 are orthogonal to the vector potential, as shown in FIG. 19(B). Therefore, the electric conductance F of the electromagnetic field detecting element 800 is not reduced (See the middle diagram of FIG. 19(B)).

Further, when the traveling direction of the path e1 is the same as the vector potential while that of the path e2 is opposite to the vector potential as shown in FIG. 19(C), a phase change will take place between two ballistic electrons. However, the phase difference between the two ballistic electrons in this case is an inverse of the phase difference shown in FIG. 19(A), and is $-2\pi\Delta\Phi/\Phi_0$. The amount of magnetic flux in an area between the paths of the two ballistic electrons is $-\Delta\Phi$. The electric conductance F of the electromagnetic field detecting element 800 at this point is reduced by the same amount reduced in the case of FIG. 19(A) (See the middle diagram of FIG. 19(C)). Note however that the directions of the changes in the cases shown in the middle diagram of FIG. 19(A) and in the middle diagram of FIG. 19(C) are opposite to each other, because the magnetic flux amounts $\Phi$; i.e., the positive and negative of the phase differences in two cases are different.

Here, an identical phase shift is introduced between two ballistic electrons, by varying an external magnetic field B, an electric field E, the magnetic permeability $\mu$ of the insulation layer 804d, or the dielectric constant $\in$, so that the magnetic flux amount is $\Phi+\theta$. $\theta(B, E, \mu, \in)$ is a function of the magnetic field B, the electric field E, the magnetic permeability $\mu$, and the dielectric constant $\in$. For example, through a phase control using the phase controlling circuit shown in FIG. 6, 8, 10, or 12, the sensitivity of the electromagnetic field detecting element 804 for detecting an electromagnetic field is maximized. As is understood by comparing the middle diagrams of FIGS. 19(A), (B), and (C), the difference among the electron conductance F of these cases is relatively small before the phase control is performed. As is understood by comparing the middle diagrams of FIGS. 19(A) and 19(B), the electric conductance F is the same in these two cases. On the other hand, when the magnetic flux amount is Φ+θ, a reproducing operation at the antiphase to the magnetic record bit (reproducing operation with inverse polarity (plus and minus) to that of signal of the magnetic record bit) is performed while θ>0, and the detection sensitivity is maximized when θ=π/2. That is, as is understood by comparing the right diagrams of the FIGS. 19(A), (B), (C), the difference among the electric conductance F of these cases are relatively large, and by comparing the right diagrams of FIGS. 19(A) and 19(C), it is understood that the difference between the electric conductance F of these cases is the maximum value. Accordingly, a highly accurate detection of the magnetic record bit information is possible by monitoring the electric conductance at this time. Similarly, while θ<0, a reproducing operation at the in phase to the magnetic record bit is performed, and the detection sensitivity is maximized when θ=−π/2.

This example deals with a magnetic recording; however, the electromagnetic field detecting element 804 directly detects a vector potential in theory, and therefore is capable of detecting an electric field and a near field in addition to a magnetic field. Therefore, when the information storage medium 704 is constituted by a phase change storage medium, the electromagnetic field detecting element 804 is able to detect an electric field E of the magnetic record bit 704 in the phase change storage medium, or a near field which is generated from the electromagnetic field generating element 803 and reflected on the magnetic record bit 704c. The electromagnetic field detecting element 804 and the information recording track 704b may be arranged at any given angle. At any angle, the detection is possible. Thus, by forming the area between the paths of two ballistic electrons with a size of 25 nm square, there is provided an information recording/reproducing head for performing recording/reproducing operations, which is capable of detecting electromagnetic field information supporting the storage surface density of over 1 Tb/inch$^2$.

Next, the operation of the information recording/reproducing device 700 is described. FIG. 20 is a schematic block diagram for explaining an operation of recording/reproducing performed by an information recording/reproducing device 700.

The information recording/reproducing device 700 includes: a recording/reproducing control terminal 901 which controls recording/reproducing operation according to instruction from a higher-level device; an input terminal 902 to which a record data from the higher-level device is input; and an output terminal 903 which outputs reproducing data to the higher-level device. Further, the information recording/reproducing device 700 includes: a recording/reproducing control section 904 which is connected to the recording/reproducing control terminal 901, and which controls recording/reproducing operation; a data recording section 905 which is connected to the input terminal 902, and which converts the record data into a record signal; a data reproducing section 906 which is connected to the output terminal 903, and which encodes a reproducing signal. Further, the information recording/reproducing device 700 includes: a laser emitting section 907 having a semiconductor laser element 802; a laser driving section 908; an electromagnetic field generating section 909 having an electromagnetic field generating element 803; a current/voltage control section 910; and an electromagnetic field detecting section 911 having an electromagnetic field detecting element 804.

The recording/reproducing control section 904 is connected to: the data recording section 905; the data reproducing section 906; the laser driving section 908 which controls a laser driving current of the laser emitting section 907; and the current/voltage control section 910 which controls, according to a record signal from the data recording section 905, a current to be fed to the electromagnetic field generating section 909 for generating a record magnetic field. In response to an instruction from the recording/reproducing control section 904, the electromagnetic field detecting section 911 receives a laser beam from the laser emitting section 907 or a near field generated from the electromagnetic field generating section 909, and then outputs the detection signal in the form of laser beam strength to the recording/reproducing control section 904. The recording/reproducing control section 904 controls the laser driving section 908 so as to keep the laser beam strength or the near field generated from the electromagnetic field generating section 909 constant. Further, the electromagnetic field detecting section 911 detects a strength change attributed to an interaction between the information storage medium 704 and near fields generated from the electromagnetic field generating section 909, and outputs the detection result to the data reproducing section 906.

A conventional magnetic recording is performed as follows. Namely, in response to a record signal from the data recording section 905 or an instruction from the recording/reproducing control section 904, the current/voltage control section 910 controls the electromagnetic field generating section 909 so that the section 909 generates a current according to record data, thereby recording information on the information storage medium 704. The near field assisted magnetic recording is performed as follows. Namely, in addition to the steps performed in the conventional magnetic recording, the laser driving section 908 is controlled in response to an instruction from the recording/reproducing control section 904, and the laser emitting section 907 generates a laser beam of a desirable strength. A near field is generated in the electromagnetic field generating section 909 to locally heat the information storage medium 704. Thus, the near field assisted magnetic recording is realized only in the heated area, and the information recording is performed. Further, a phase change recording using a near field NF is performed as follows. Namely, in response to a signal from the data recording section 905, the recording/reproducing control section 904 outputs an instruction to the laser driving section 908, and the laser emitting section 907 generates a laser beam of a desirable strength. A near field is generated in the electromagnetic field generating section 909 to locally heat the information storage medium 704. Thus, the phase change magnetic recording is realized only in the heated area, and the information recording is performed.

As a preparation of a reproducing operation, the above mentioned phase controlling circuit is used to perform a desirable phase shift with respect to ballistic electrons in the electromagnetic field detecting section 911, so as to maximize the sensitivity of detecting the electromagnetic field. During the reproducing operation, a desirable magnetic field, electric field, or near field is generated from the electromagnetic field generating section 909, in response to an instruction from the recording/reproducing control section 904. The electromagnetic field detecting section 911 detects electromagnetic field information from record marks on the information storage medium 704, and outputs a reproducing signal to the data reproducing section 906. The data reproducing section 906 converts the reproducing signal into reproducing data and outputs the reproducing data to the output terminal 903, in response to an instruction from the recording/reproducing control section 904.

With the present embodiment, the information recording/reproducing head 800 disposed on the substrate 806 is integrally formed with the slider 703. Therefore, a processes resembling to those for known magnetic heads can be adopted, and therefore the productivity is improved. Further, since the terminals of the elements are integrally formed on the substrate 806 integrally formed with the slider 703, the access of the terminal to outside is made easier, and therefore the productivity is improved. Further, the information recording/reproducing head 800 can be moved to a desirable position of the information storage medium 704, and is able to record/reproduce electromagnetic field information on/from nano sized areas corresponding to a storage surface density of 1 Tb/inch$^2$. Therefore, an information recording/reproducing device for a high density of over 1 Tb/inch$^2$ is provided.

Note that the present invention is not limited to the above embodiments, and may be varied or modified within a scope of the claims set forth hereinbelow. For example, it is possible to adopt the electromagnetic field detecting element of either one of Alternative Form 1 or 2 of Embodiment 1 in place of electromagnetic field detecting elements of Embodiments 2 to 5. Further, an electromagnetic field detecting circuit may be a combination of Embodiments 2 to 4. Further, in the above embodiments, the opposing surfaces of a pair of electrodes are orthogonal to the surfaces of the three insulation layers. However, the opposing surfaces may be parallel to the surfaces of the three insulation layers.

Figure 1:
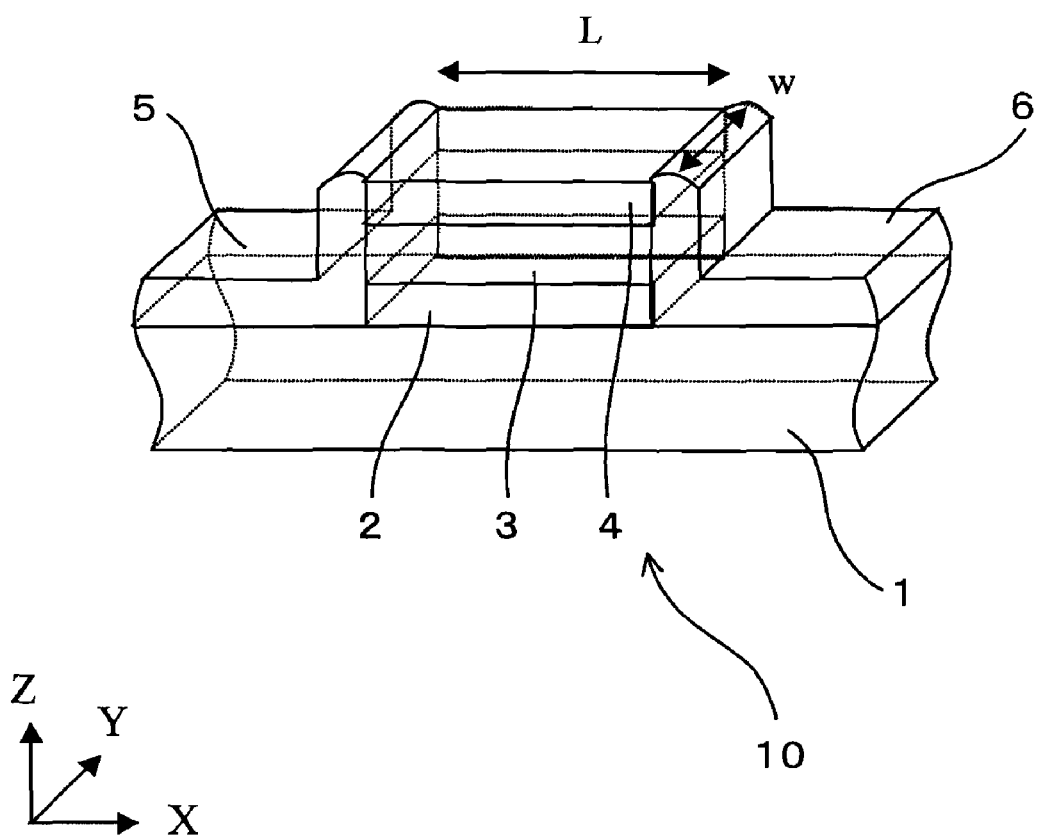
FIG. 1 is a perspective view showing a configuration of an electromagnetic field detecting element of Embodiment 1, according to the present invention.
Figure 2:
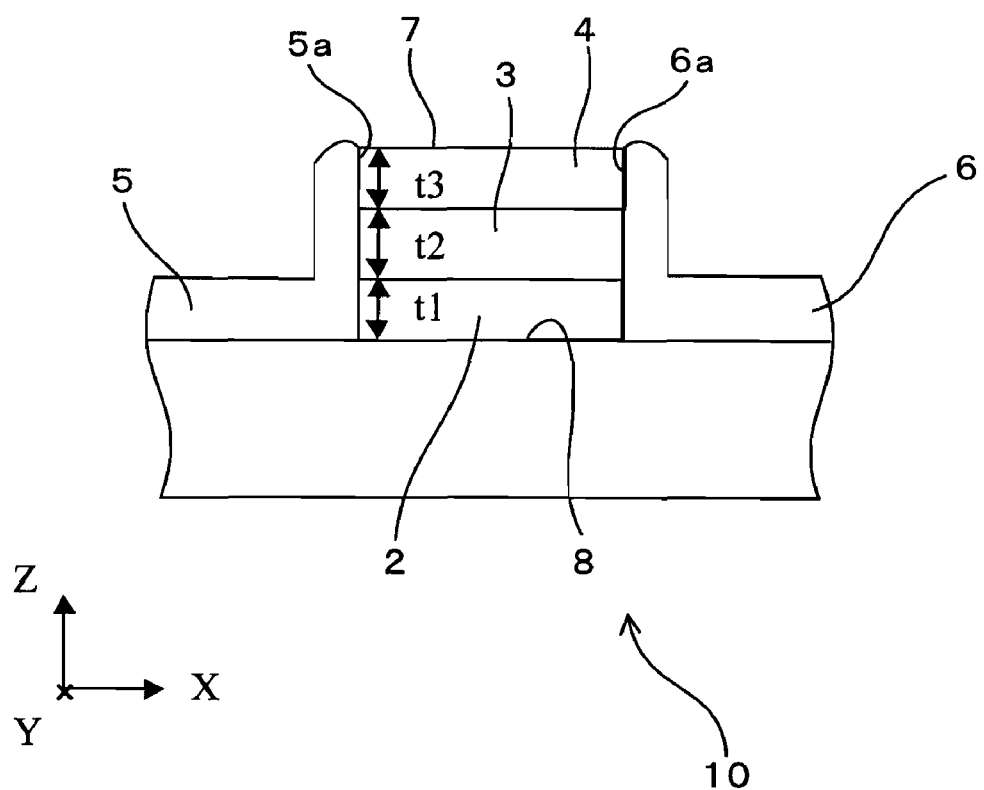
FIG. 2 is a diagram showing the configuration of the electromagnetic field detecting element 10 of FIG. 1, viewed in a Y-axis direction.
Figure 3:
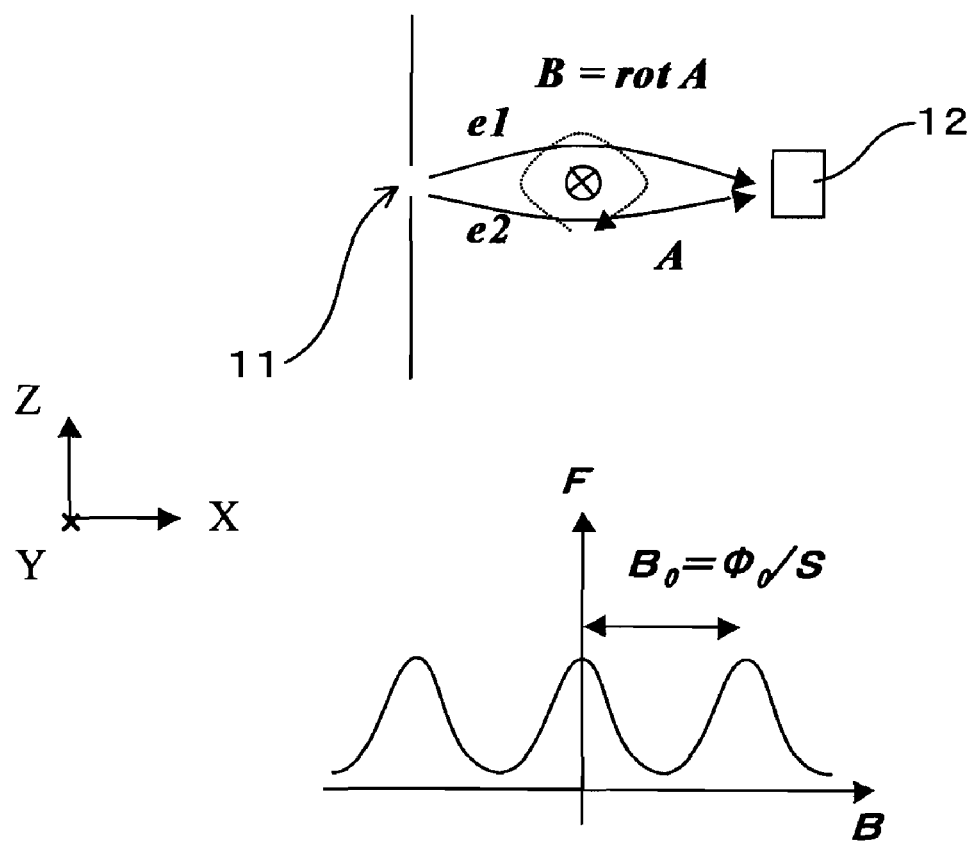
FIG. 3 is a diagram which is referred to for explaining AB effect principle.
Figure 4A:
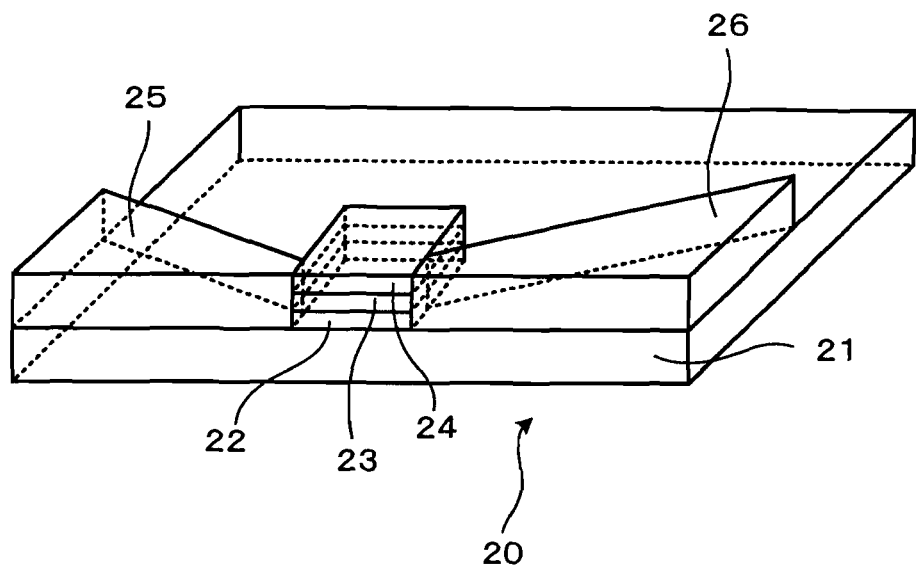
FIG. 4 are diagrams showing an alternative form 1 of the electromagnetic field detecting element of FIG. 1, where (a) is a perspective configuration view and (b) is a top view.
Figure 4B:
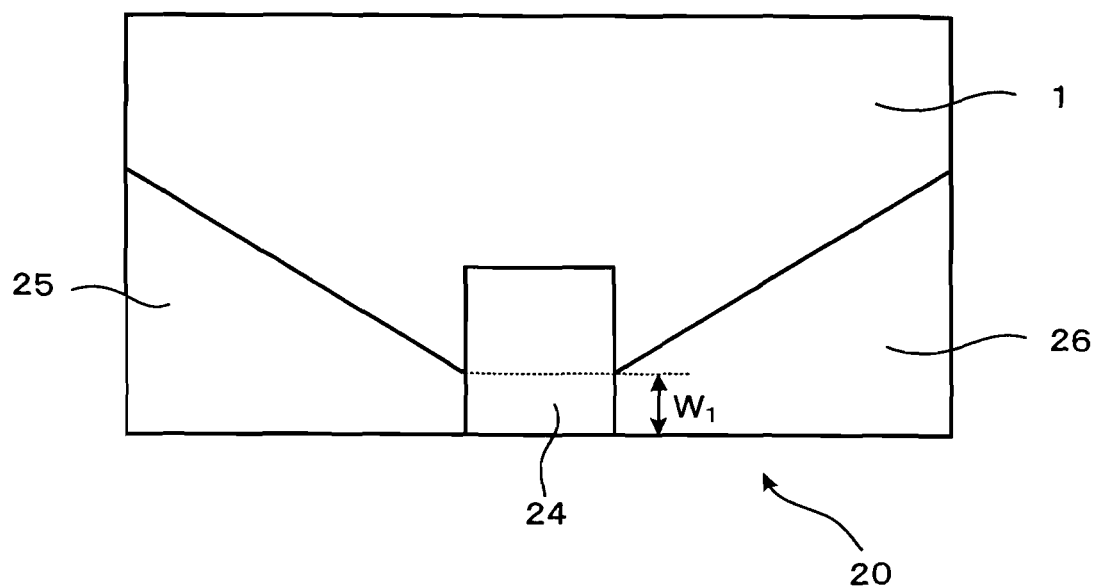
Figure 5:
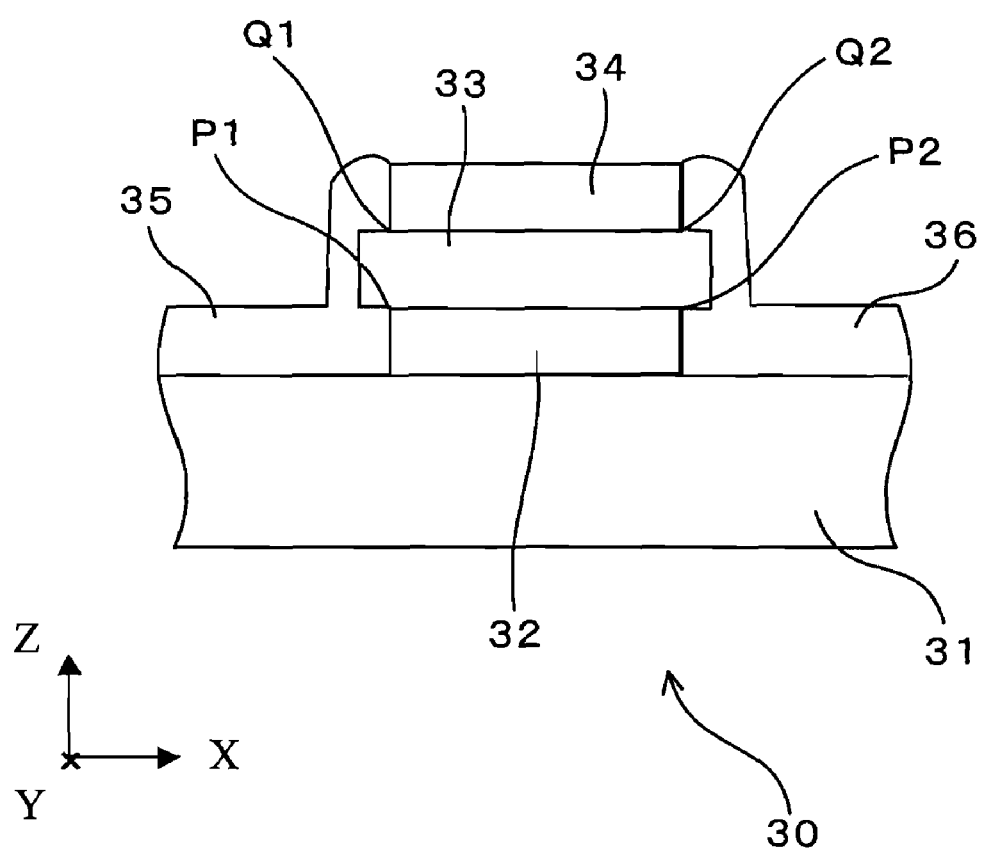
FIG. 5 is a diagram showing the configuration of Alternative Example 2 of the electromagnetic field detecting element of Embodiment 1, viewed in a Y-axis direction.
Figure 6:
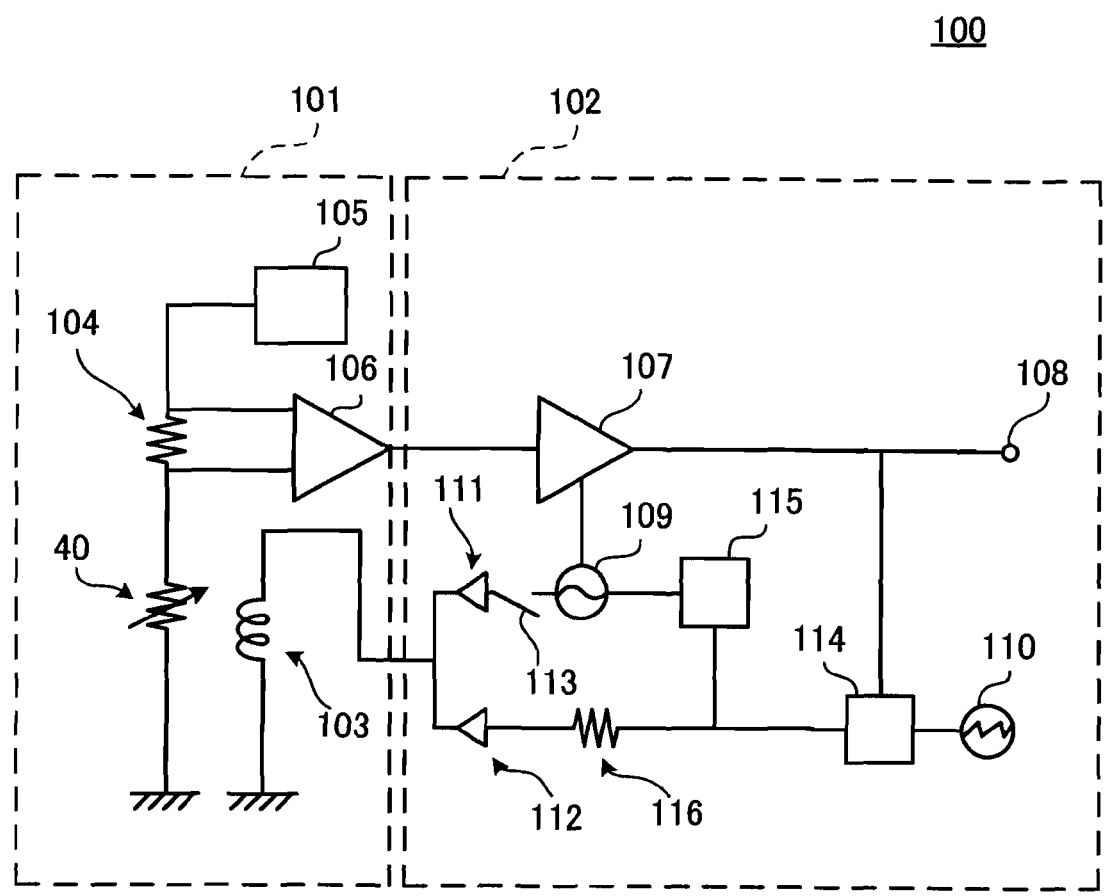
FIG. 6 is a schematic diagram showing an electromagnetic field detecting circuit of Embodiment 2, according to the present invention.
Figure 7:
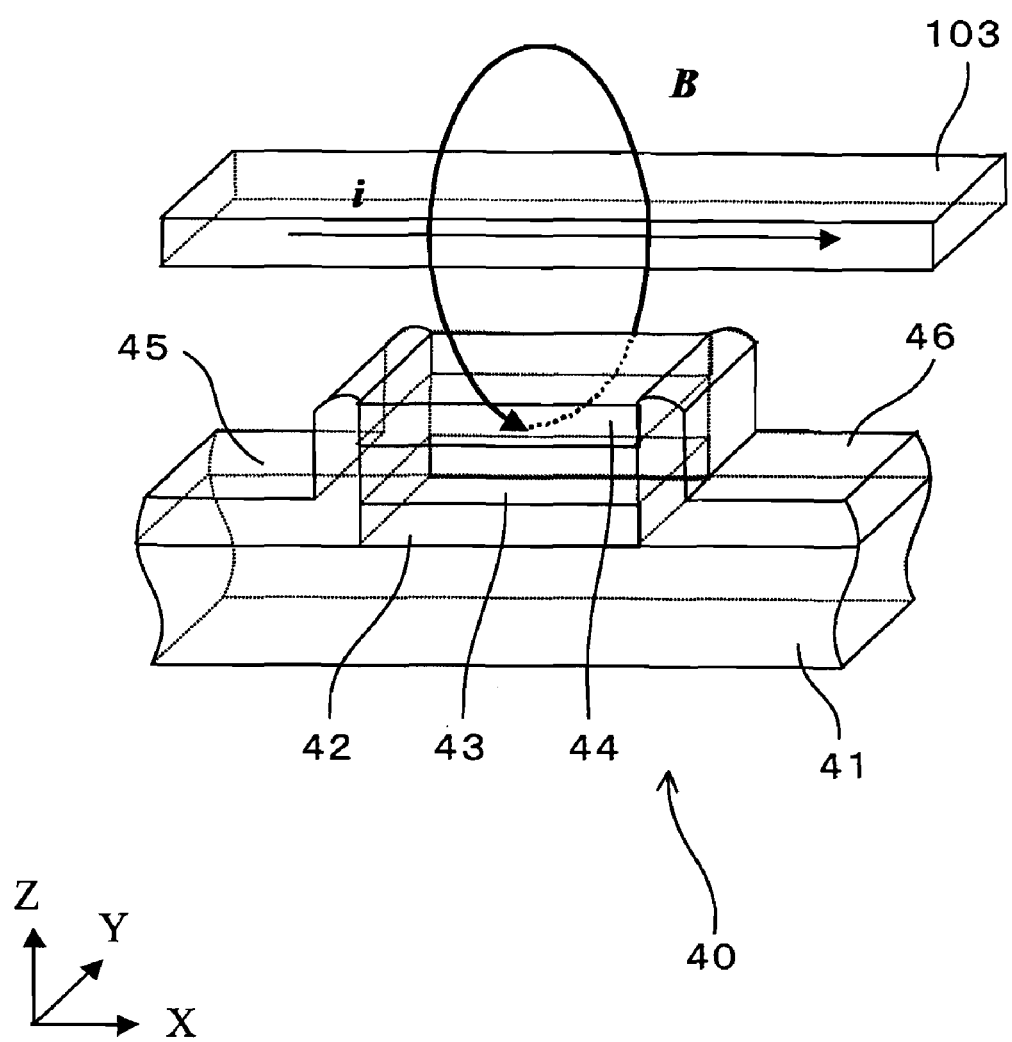
FIG. 7 is a perspective configuration view specifically showing a relation between a magnetic field generating source and the electromagnetic field detecting element of the electromagnetic field detecting circuit of FIG. 6.
Figure 8:
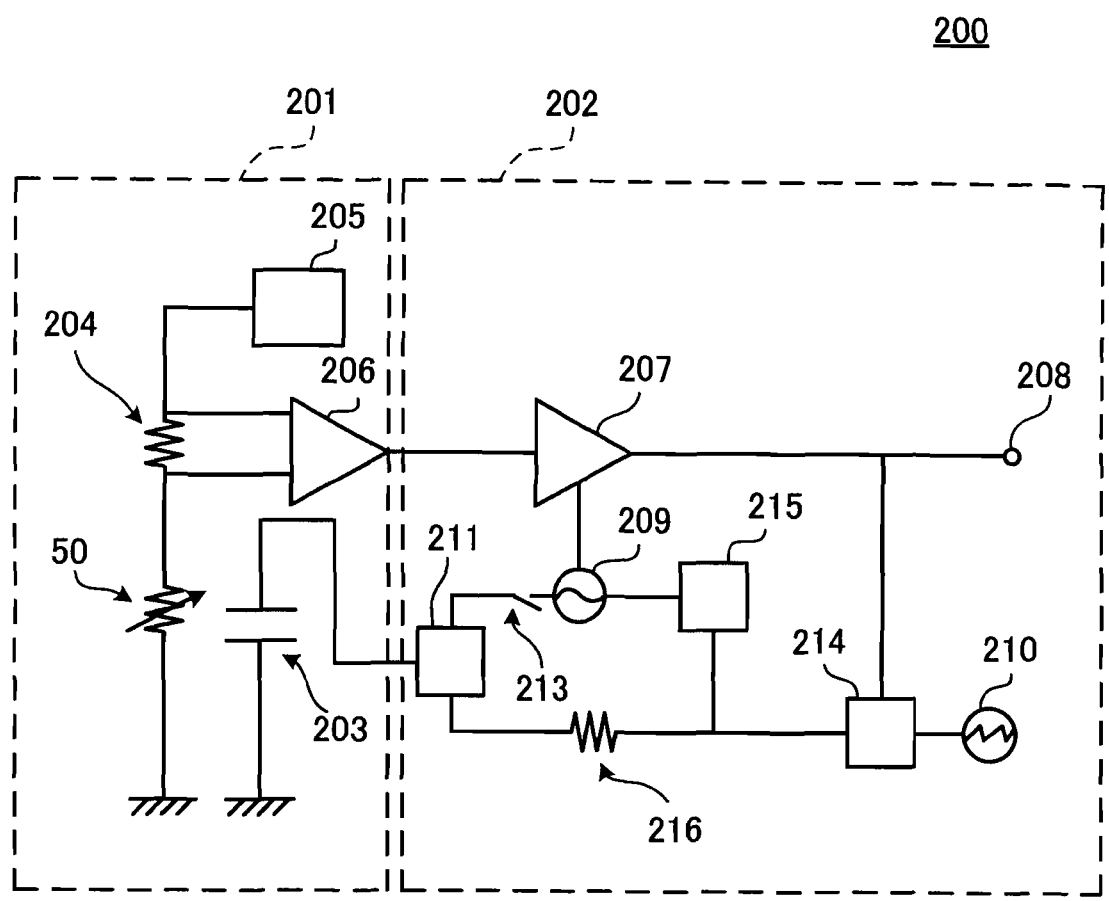
FIG. 8 is a schematic diagram of an electromagnetic field detecting circuit of Embodiment 3, according to the present invention.
Figure 9:
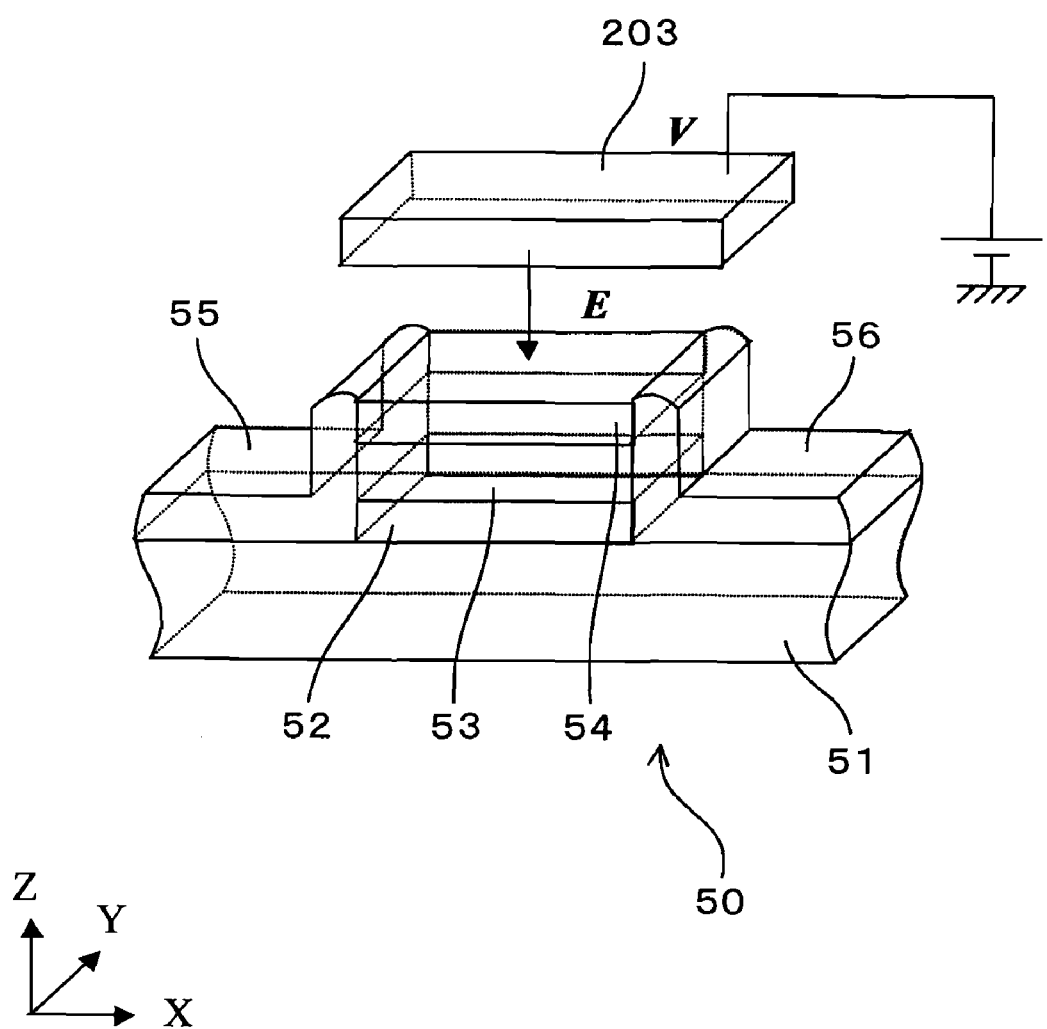
FIG. 9 is a perspective configuration view specifically showing a relation between a magnetic field generating source and the electromagnetic field detecting element of the electromagnetic field detecting circuit of FIG. 8.
Figure 10:
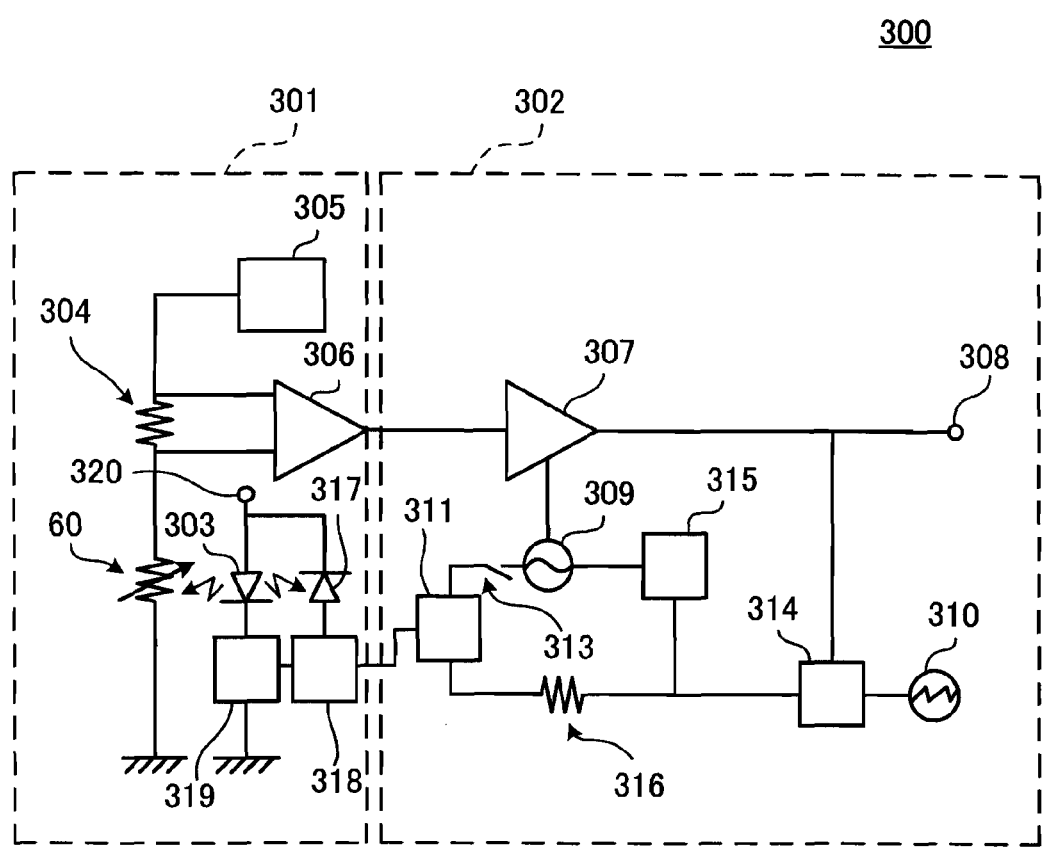
FIG. 10 is a schematic diagram of an electromagnetic field detecting circuit of Embodiment 4, according to the present invention.
Figure 11:
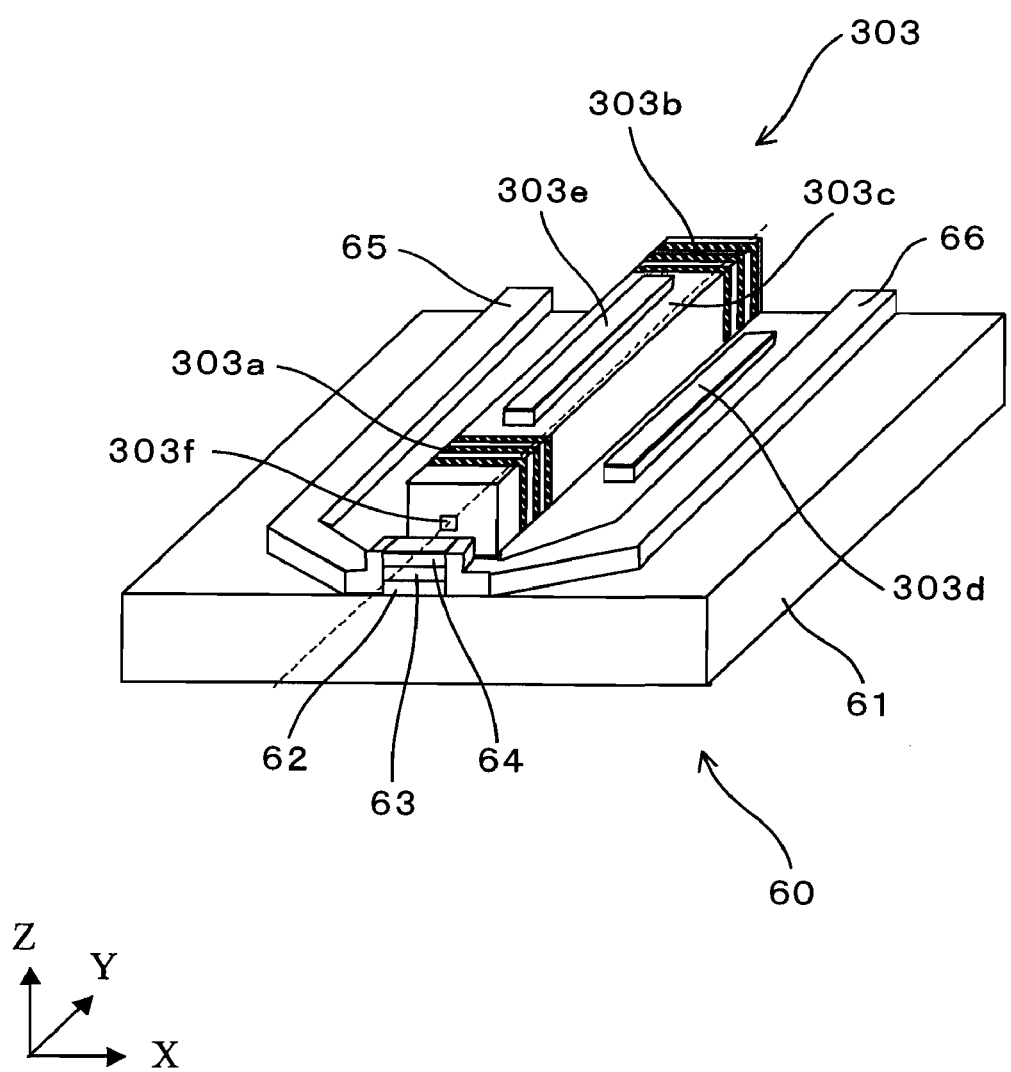
FIG. 11 is a perspective configuration view specifically showing a relation between a magnetic field generating source and the electromagnetic field detecting element of the electromagnetic field detecting circuit of FIG. 10.
Figure 12:
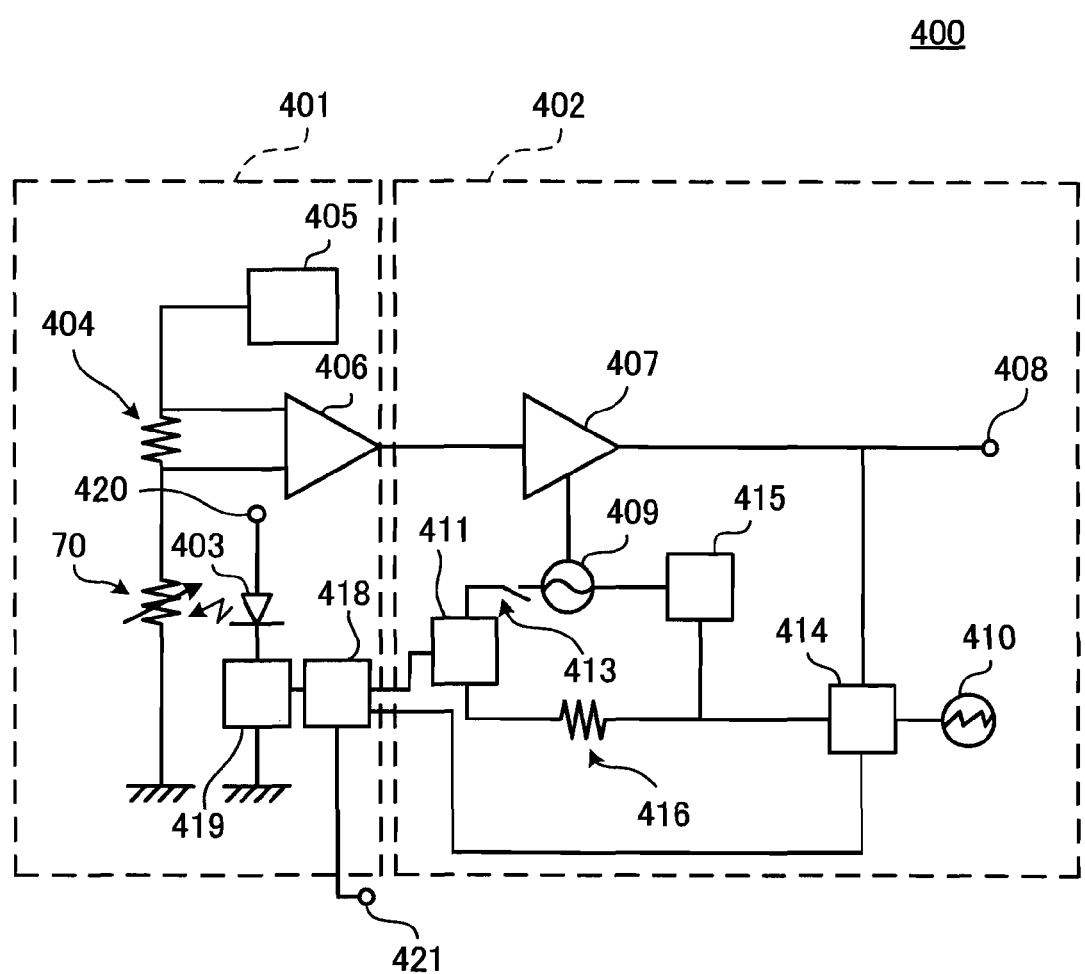
FIG. 12 is a schematic diagram showing an alternative form of the electromagnetic field detecting circuit of Embodiment 4, according to the present invention.
Figure 13:
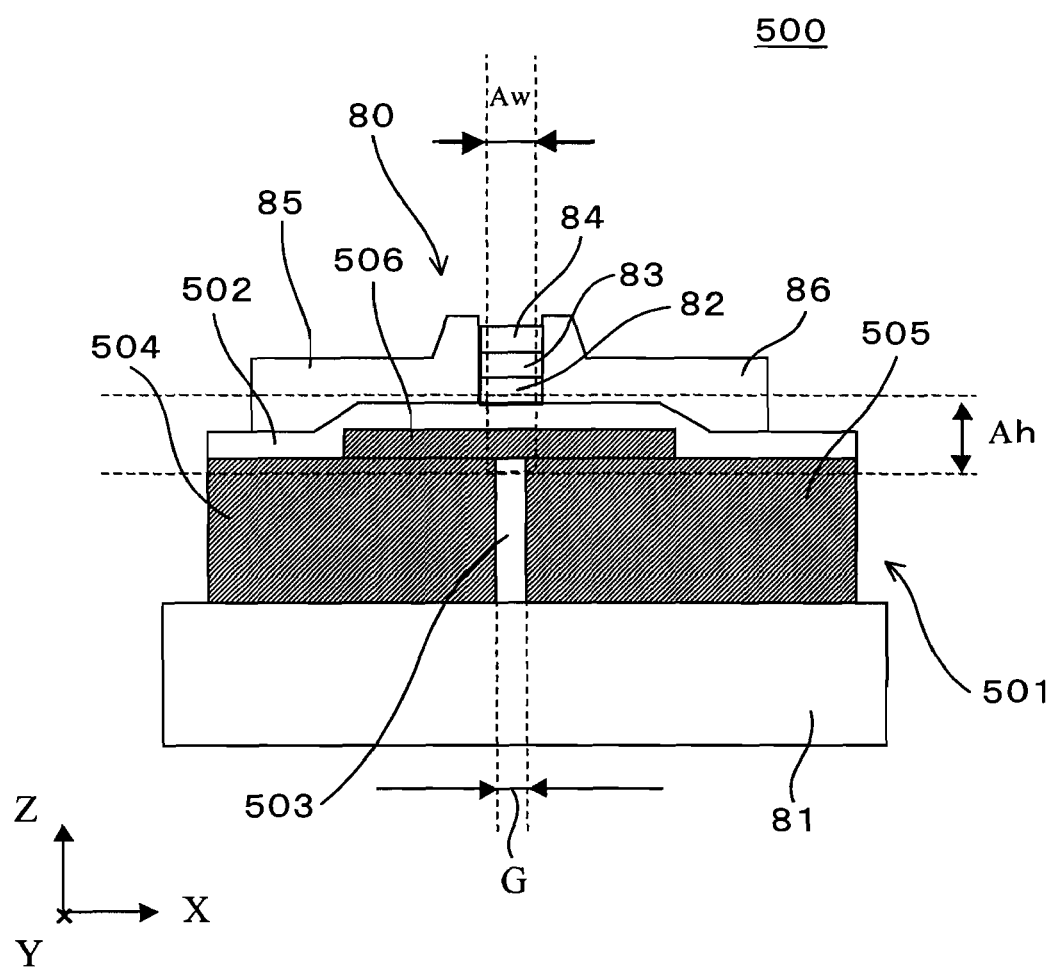
FIG. 13 is a front configuration view showing a magnetic recording/reproducing head of Embodiment 5, according to the present invention.
Figure 14:
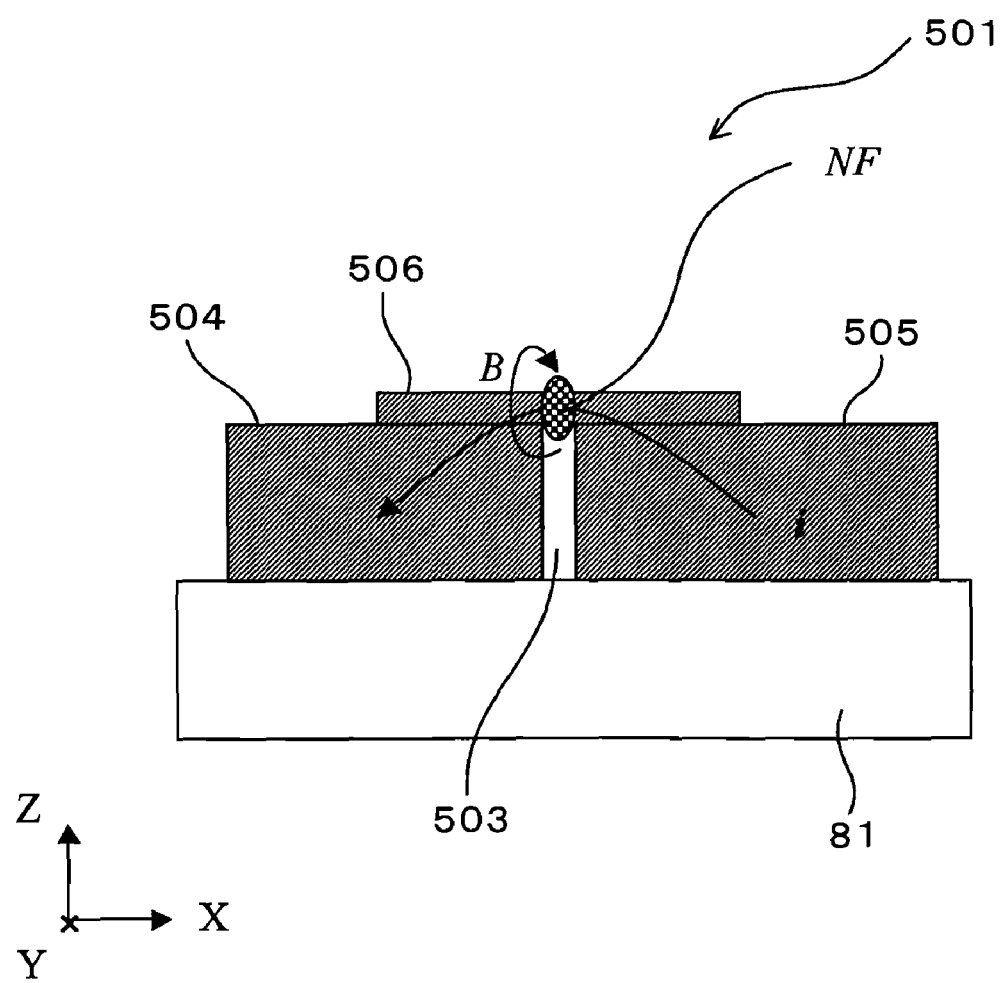
FIG. 14 is a diagram explaining an electromagnetic field generating principle adopted in an electromagnetic field generating element of the magnetic recording/reproducing head shown in FIG. 13.
Figure 15:
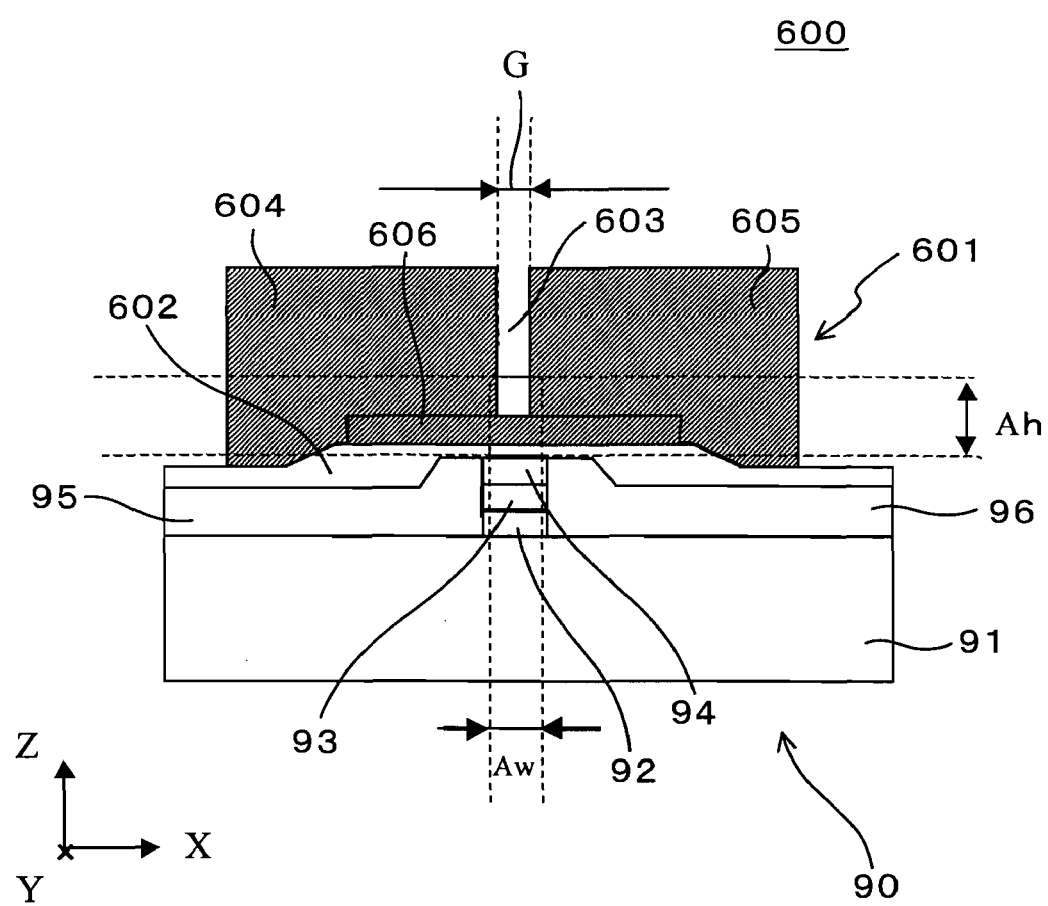
FIG. 15 is a front configuration view showing an alternative form of the magnetic recording/reproducing head of Embodiment 5, according to the present invention.
Figure 16:
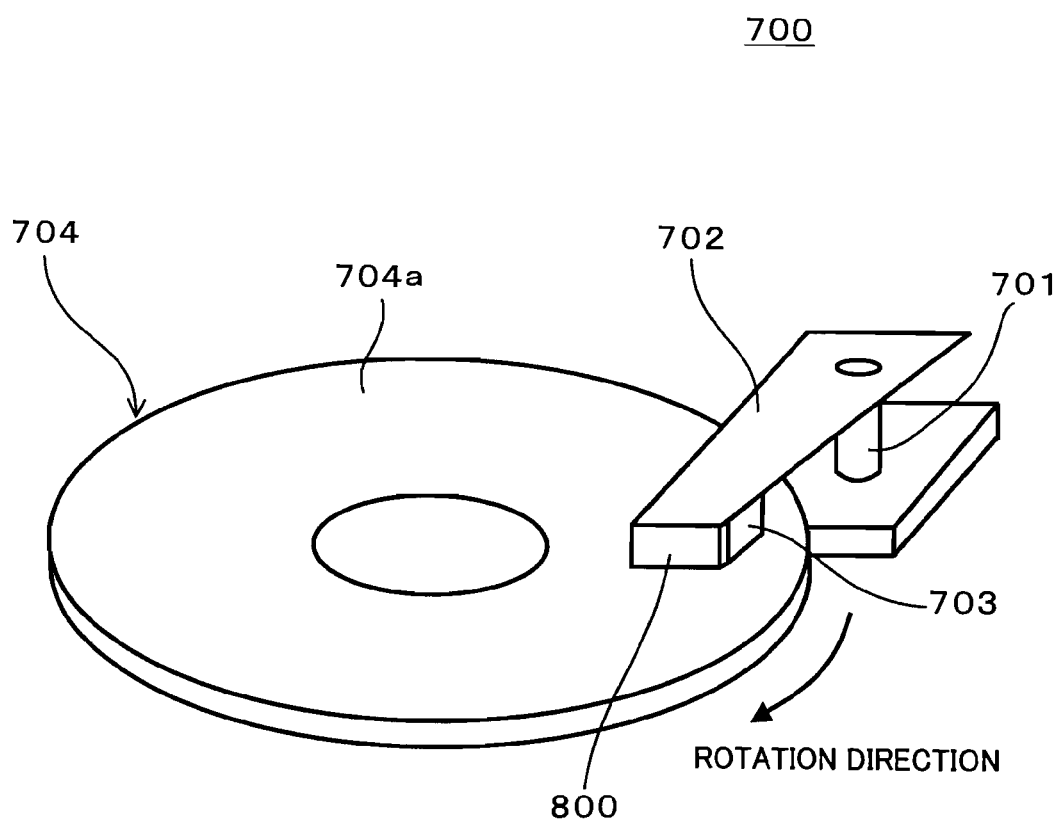
FIG. 16 is a perspective diagram showing a configuration of a main part of the information recording/reproducing device of Embodiment 6, according to the present invention.
Figure 17:
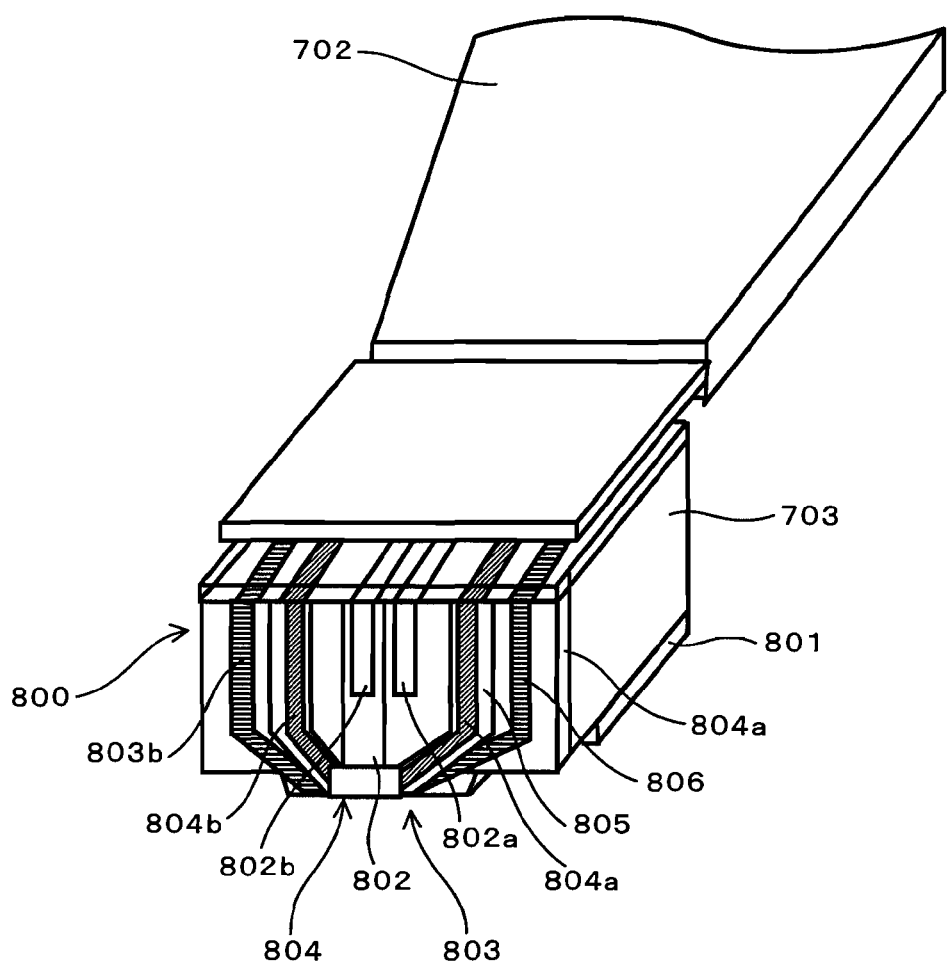
FIG. 17 is an enlarged perspective diagram showing a part nearby an information recording/reproducing head of the information recording/reproducing device shown in FIG. 16.
Figure 18:
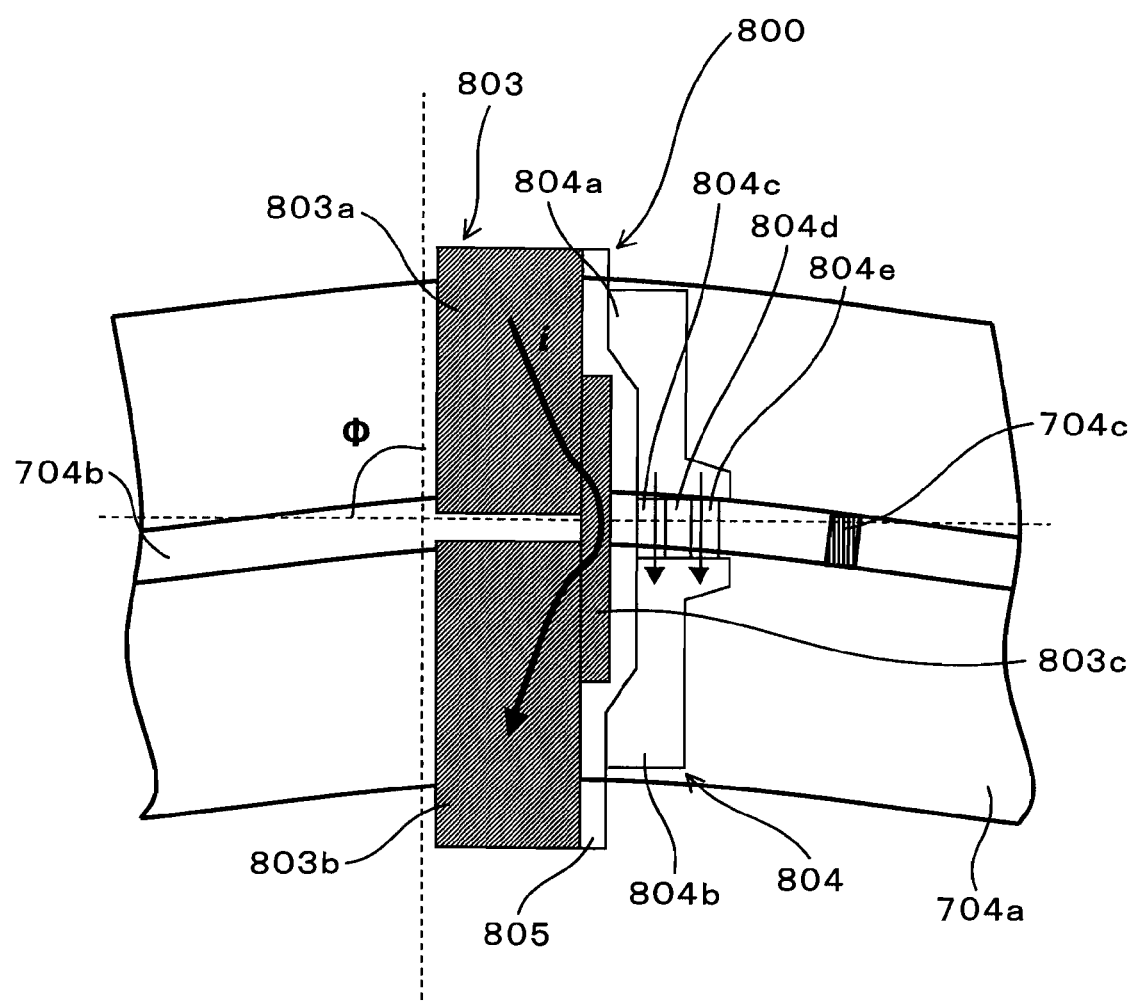
FIG. 18 is a diagram for explaining an operation of recording/reproducing magnetic field information which is performed by the information recording/reproducing head, of the information recording/reproducing device of FIG. 16, with respect to an information storage medium.
Figure 19:
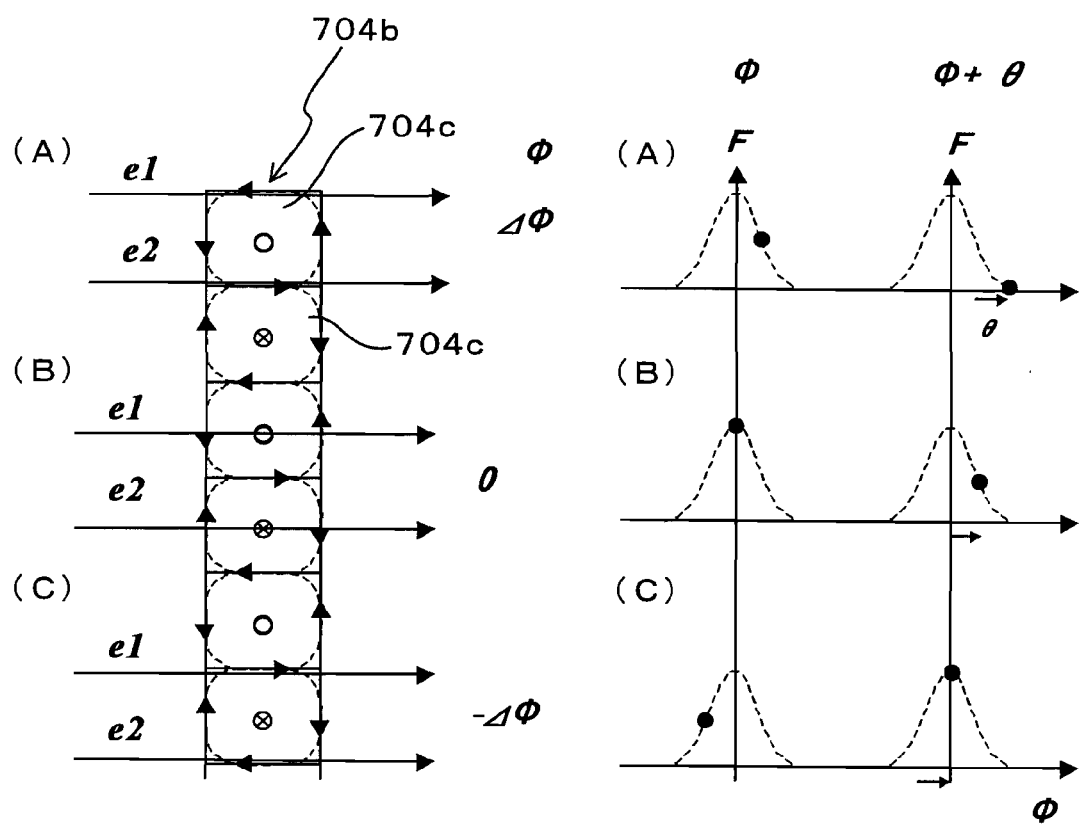
FIG. 19 is an explanatory diagram showing electromagnetic field detection performed when a magnetic record bit passes nearby an electromagnetic field detecting element, the magnetic record bit being written on an information recording track of the information storage medium shown in FIG. 18.
Figure 20:
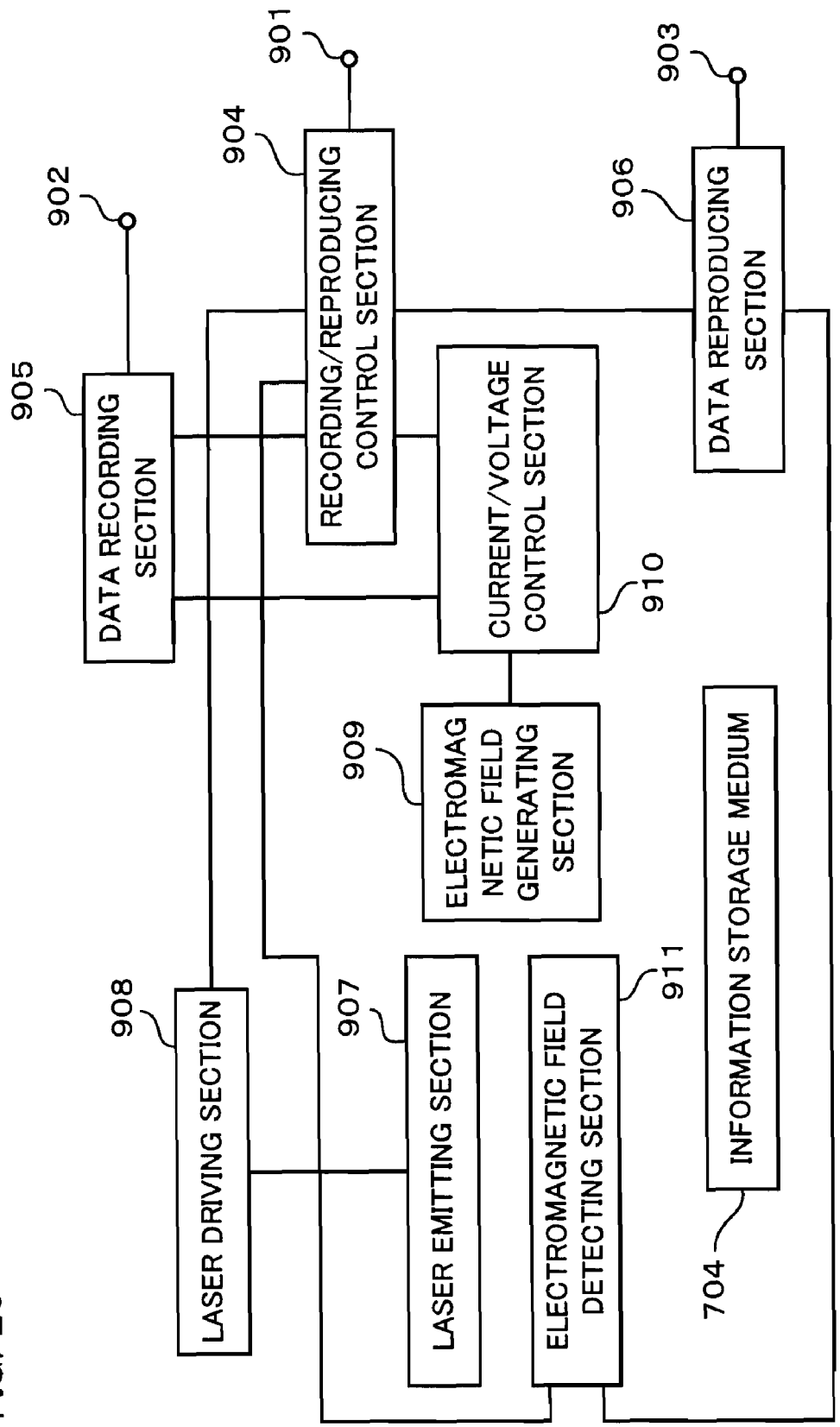
FIG. 20 is a schematic block diagram for explaining an operation of writing/reproducing performed by an information recording/reproducing device 700.
Figure 21:
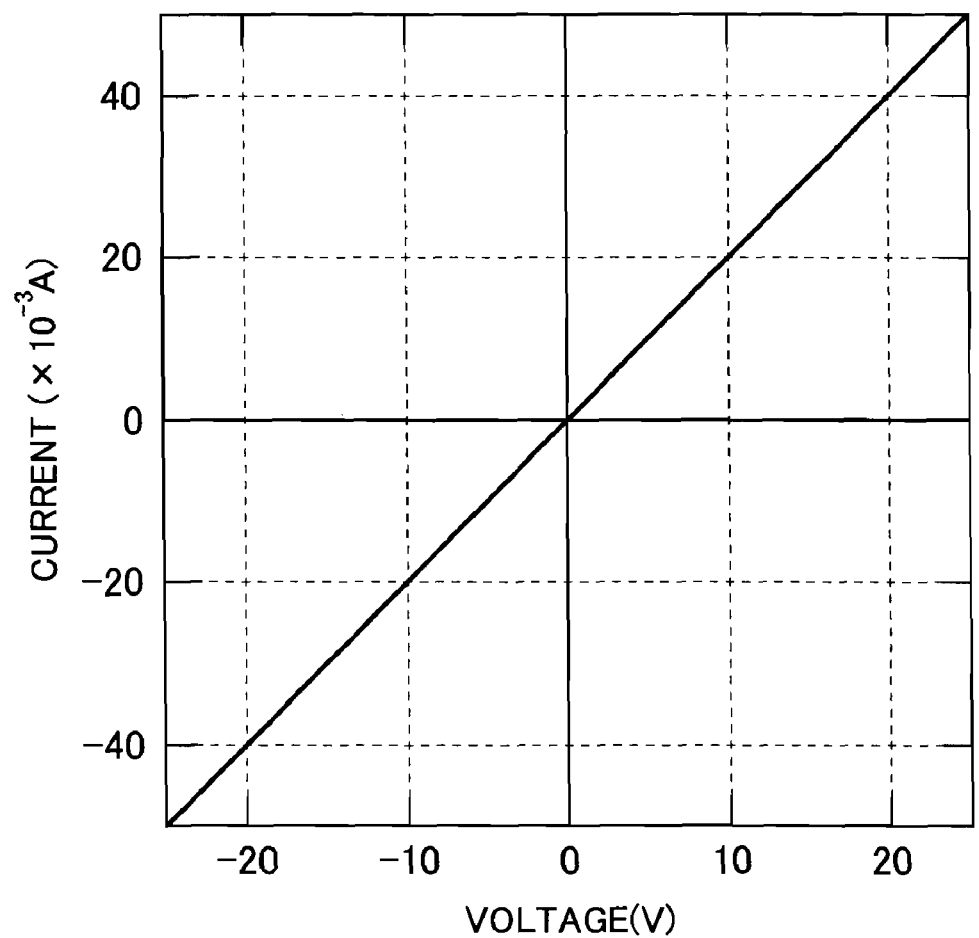
FIG. 21 is a diagram showing a current-voltage characteristic of an electromagnetic field detecting element having substantially the same configuration as that of the electromagnetic field detecting element 10 of FIG. 1.
Figure 22:
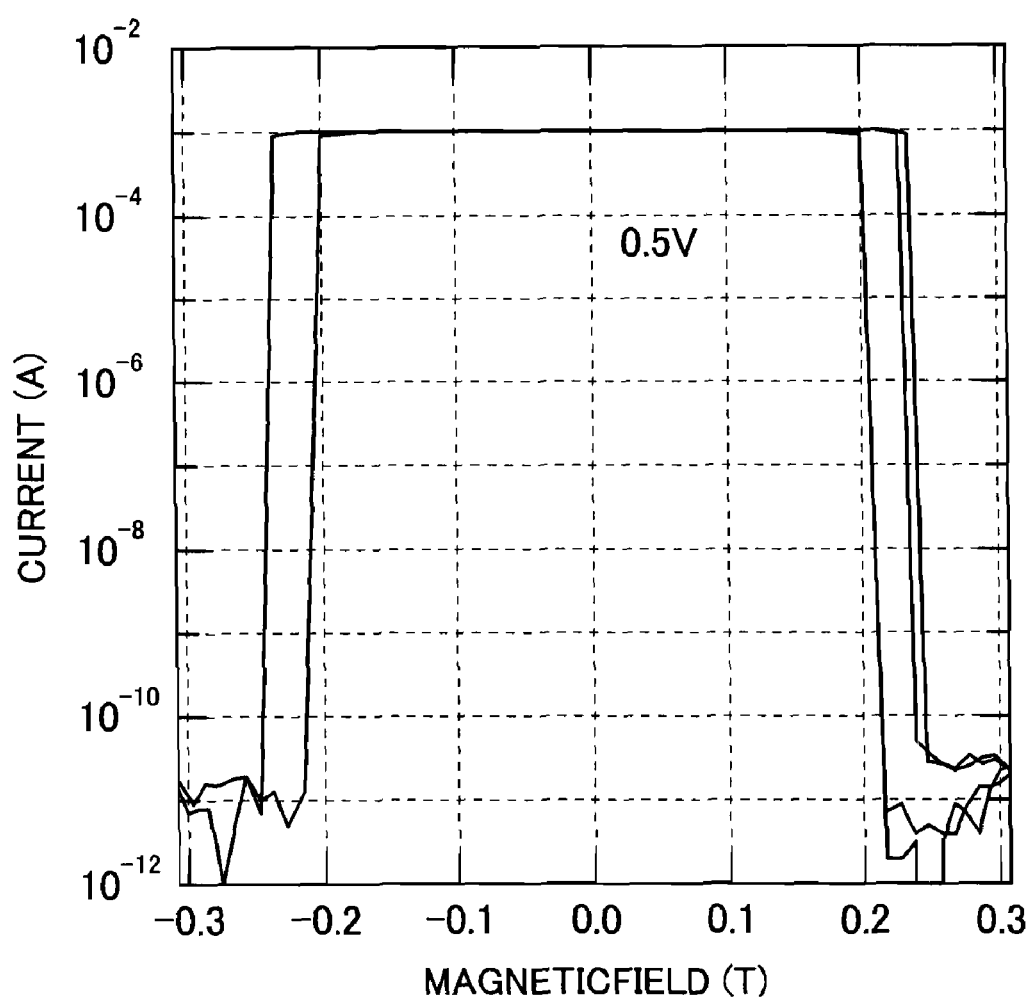
FIG. 22 is a diagram showing a current-magnetic field characteristic at the time of applying a voltage of 10V to the electromagnetic field detecting element used in FIG. 21.
Figure 23:
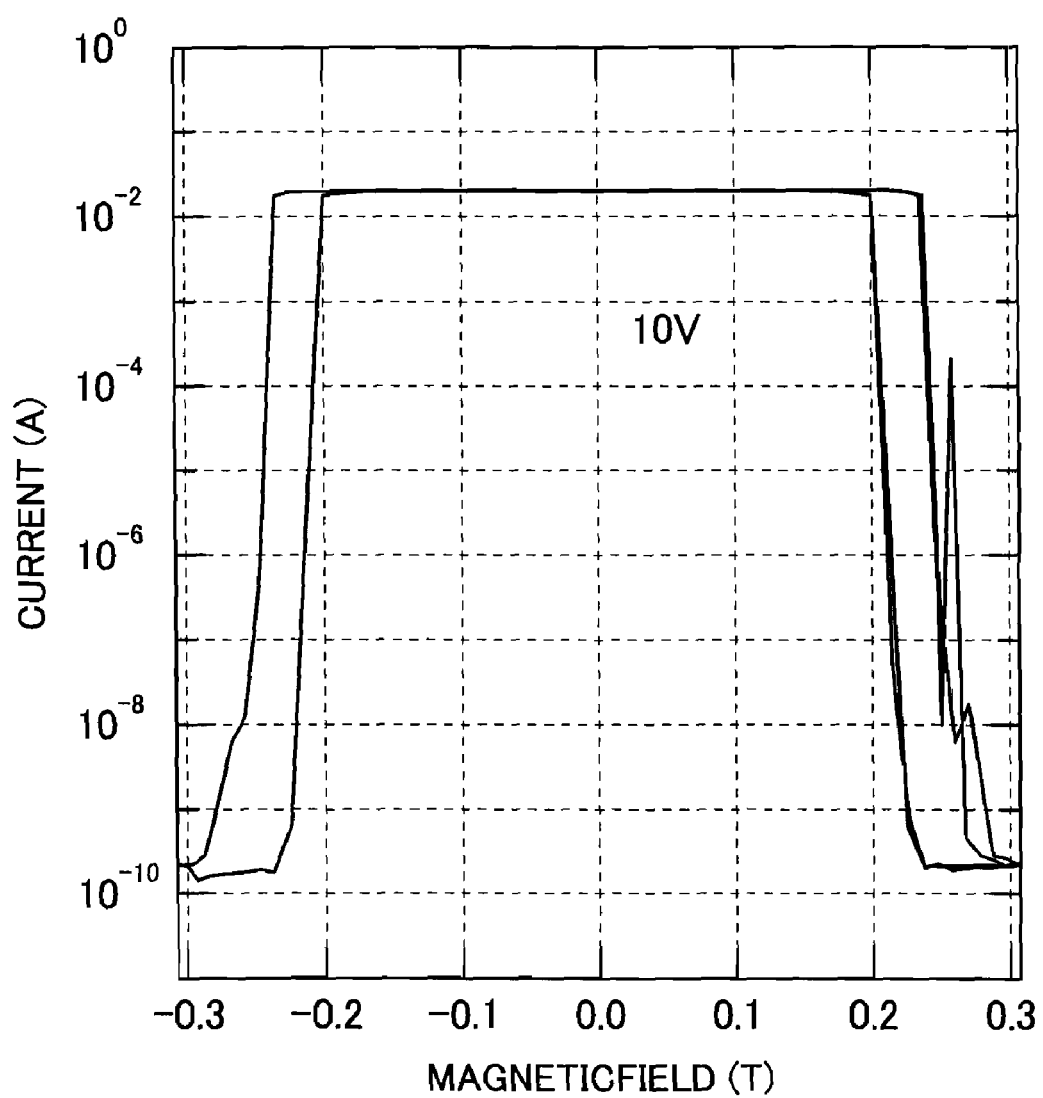
FIG. 23 is a diagram showing a current-magnetic field characteristic at the time of applying a voltage of 0.5V to the electromagnetic field detecting element used in FIG. 21.

REFERENCE NUMERALS 1, 21, 31, 41, 51, 61, 81, 91, 806 Substrate
2, 3, 4, 22, 23, 24, 32, 33, 34, 42, 43, And 44, 52, 53, 54, 62, 63, 64, 82, 83, And 84, 92, 93, 94, 502, 602, 804c, 804d, 804e, 805 Insulation Layer
5, 6, 25, 26, 35, 36, 45, 46, 55, 56, 65, 66, 85, 86, 303d, 303e, 504, 505, 604, 605, 802a, 803a, 803b, 804a, 804b Electrode
5a, 6a Opposing Surface
7, 8 Boundary
10, 20, 30, 40, 50, 60, 70, 80, 90, 804 Electromagnetic Field Detecting Element
11 Electron Ray Source
12 Electron Ray Detector
100, 200, 300, 400 Electromagnetic Field Detecting Circuit
101, 201, 301, 401 Electromagnetic Field Detecting Sensor
102, 202, 302, 401 Phase Controlling Circuit
103 Magnetic Field Generating Source
103a Metal Thin Line
104, 204, 304, 404 Reference Resistor 105, 205, 305, 405 Constant Voltage Power Source Circuit
106, 206, 306, 406 Signal Amplifier
107, 207, 307, 407 Lock-In Detector
108, 208, 308, 408, 903 Output Terminal
109, 110, 209, 210, 309, 310, 409, 410 Modulated Signal Transmitter
111, 112 V/I Converter
113, 213, 313, 413 Switch
114, 214, 314, 414 Hold Circuit
115, 215, 315, 415 Switch Circuit
116, 216, 316, 416 Resistor
203 Electric Field Generating Source
211, 311, 411 Voltage Generating Circuit
303, 403, 802 Semiconductor Laser Element
303a Distributed Bragg Reflector
303c Laser Beam Oscillating Section
303f Active Region
317, 417 Photodetecting Element
318, 418 Laser Drive Circuit
319, 419 Laser Drive Current Output Circuit
320, 420, 421, 902 Input Terminal
500, 600, 800 Information Recording/Reproducing Head
501, 601, 803 Electromagnetic Field Generating Element
503, 603 Insulator
506, 606, 803c Conductive Layer
700 Information Recording/Reproducing Device
701 Actuator
702 Arm
703 Slider
704 Information recording Medium
704a recording Surface
704b Information Recording Track
704c Magnetic Record Bit
801 Air Bearing Structure
901 Recording/Reproducing Control Terminal
904 Recording/Reproducing Control Section
905 Data Recording Section
907 Data Reproducing Section
908 Laser Emitting Section
908 Laser Driving Section
909 Electromagnetic Field Generating Section
910 Current/voltage Control Section
911 Electromagnetic Field Detecting Section

The invention claimed is:

1. An electromagnetic field detecting element, comprising:
a substrate having thereon (i) a second insulator, a first insulator, and a third insulator which are laminated in this order on the substrate to form a lamination, and (ii) a pair of opposing electrodes disposed so as to interpose therebetween the lamination, the pair of opposing electrodes having opposing surfaces,
wherein the first insulator is disposed within an overlapping area of the opposing surfaces in one direction along the opposing surfaces,
the first insulator has a dielectric breakdown strength larger than dielectric breakdown strengths of the second and the third insulators, and
respective widths of the second and third insulators in the one direction along the opposing surfaces are not more than a mean free path of electrons in a conductive material constituting the pair of opposing electrodes.

2. The electromagnetic field detecting element according to claim 1, wherein the second and third insulators contact both of the two opposing surfaces of the pair of opposing electrodes.

3. The electromagnetic field detecting element according to claim 1, wherein the first to third insulators form a lamination whose surfaces are parallel to each other.

4. The electromagnetic field detecting element according to claim 1, wherein the opposing surfaces of the pair of electrodes are orthogonal to the surfaces of the first to third insulators.

5. The electromagnetic field detecting element according to claim 1, wherein at least one of the first to third insulators is made of a material having a relative magnetic permeability of 3 or more.

6. The electromagnetic field detecting element according to claim 1, wherein at least one of the first to third insulators is made of a material having a relative dielectric constant of 4 or more.

7. The electromagnetic field detecting element according to claim 1, wherein the shortest distance between the two opposing surfaces of the pair of electrodes is 100 nm or less.

8. The electromagnetic field detecting element according to claim 1, wherein a width of the first insulator in the one direction along the opposing surface is not more than a double of a mean free path of electrons in a conductive material constituting the pair of opposing electrodes.

9. The electromagnetic field detecting element according to claim 1, wherein a width of the first insulator in the one direction along the opposing surface is not more than a mean free path of electrons in a conductive material constituting the pair of opposing electrodes.

10. The electromagnetic field detecting element according to claim 1, wherein the opposing surfaces of the pair of electrodes include at least two corner portions.

11. The electromagnetic field detecting element according to claim 1, wherein the first insulator contacts at least one of the two opposing surfaces of the pair of opposing electrodes.

12. An electromagnetic field detecting sensor, comprising:
the electromagnetic field detecting element according to claim 1; and
a phase shifting member which causes shifting of a phase of a carrier passing at least one of the two current paths formed between the pair of opposing electrodes in the electromagnetic field detecting element.

13. The electromagnetic field detecting sensor according to claim 12, wherein the phase shifting member is a magnetic field generating source.

14. The electromagnetic field detecting sensor according to claim 12, wherein the phase shifting member is an electric field generating source.

15. The electromagnetic field detecting sensor according to claim 12, wherein the phase shifting member is an electromagnetic wave generating source.

16. The electromagnetic field detecting sensor according to claim 12, wherein the phase shifting member is a near field generating source.

17. An electromagnetic field detecting circuit, comprising:
the electromagnetic field detecting sensor according to claim 12; and
a phase controlling circuit which controls an amount of the phase of the carrier shifted by the phase shifting member.

18. A magnetic recording/reproducing head, comprising:
an electromagnetic field generating element which records electromagnetic field information on an information storage medium; and
the electromagnetic field detecting element according to claim 1 which reproduces the electromagnetic field information recorded on the information storage medium.

19. The information recording/reproducing head according to claim 18, wherein the electromagnetic field detecting element and the electromagnetic field generating element are integrally formed with a slider.

20. An information recording/reproducing device, comprising:
the information recording/reproducing head according to claim 18; and
moving means for moving the information recording/reproducing head to a predetermined position of the information storage medium.

* * * * *